(12) United States Patent
Sandstrom

(10) Patent No.: US 7,405,414 B2
(45) Date of Patent: Jul. 29, 2008

(54) METHOD AND APPARATUS FOR PATTERNING A WORKPIECE

(75) Inventor: Torbjorn Sandstrom, Pixbo (SE)

(73) Assignee: Micronic Laser Systems AB, Taby (SE)

( * ) Notice: Subject to any disclaimer, the term of this patent is extended or adjusted under 35 U.S.C. 154(b) by 753 days.

(21) Appl. No.: 10/498,713

(22) PCT Filed: Dec. 11, 2002

(86) PCT No.: PCT/SE02/02310

§ 371 (c)(1),
(2), (4) Date: Jun. 14, 2004

(87) PCT Pub. No.: WO03/052516

PCT Pub. Date: Jun. 26, 2003

(65) Prior Publication Data

US 2005/0084766 A1 Apr. 21, 2005

(30) Foreign Application Priority Data

Dec. 14, 2001 (SE) .................................. 0104238

(51) Int. Cl.
*G21K 5/10* (2006.01)
(52) U.S. Cl. ............... 250/492.22; 250/492.2; 250/492.23; 250/365; 250/461.1; 324/121; 359/290; 359/291; 359/292; 359/285; 359/286; 347/239; 347/255; 347/233; 438/26; 438/11; 438/25; 430/30; 430/302; 430/312; 430/5; 430/311; 356/138; 356/614; 716/19; 716/21
(58) Field of Classification Search ............ 250/492.22, 250/492.2, 492.23, 365, 461.1; 324/121; 359/290, 291, 292, 285, 286; 347/239, 255, 347/233; 438/26, 11, 25; 430/30, 302, 312, 430/5, 311; 356/138, 614; 716/19, 21
See application file for complete search history.

(56) References Cited

U.S. PATENT DOCUMENTS 4,498,010 A 2/1985 Biechler et al.

(Continued)

FOREIGN PATENT DOCUMENTS

| WO | WO 99/45441 A1 | 9/1999 |
|----|----|----|
| WO | WO 01/93303 A3 | 12/2001 |

OTHER PUBLICATIONS

Rieger, Michael L. et al. "Image quality enhancements for raster scan lithography" in *Proceedings of SPIE: Optical/Laser Microlithography*, vol. 922, Mar. 2-4, 1988.

(Continued)

*Primary Examiner*—Jack Berman
*Assistant Examiner*—Meenakshi S Sahu
(74) *Attorney, Agent, or Firm*—Ernest J. Beffel, Jr.; Haynes Beffel & Wolfeld, LLP

(57) ABSTRACT

The present invention relates to a method for creating a pattern on a workpiece sensitive to electromagnetic radiation. Electromagnetic radiation is emitted onto a computer controlled reticle having a multitude of modulating elements (pixels). The pixels are arranged in said computer controlled reticle according to a digital description. An image of said computer controlled reticle is created on said workpiece, wherein said pixels in said computer controlled reticle are arranged in alternate states along at least a part of one feature edge in order to create a smaller address grid. The invention also relates to an apparatus for creating a pattern on a workpiece. The invention also relates to a semiconducting wafer and a mask.

29 Claims, 34 Drawing Sheets

U.S. PATENT DOCUMENTS

| | | | |
|---|---|---|---|
| 4,879,605 A | 11/1989 | Warkentin et al. | |
| 4,989,255 A | 1/1991 | Manns et al. | |
| 5,103,101 A | 4/1992 | Berglund et al. | |
| 5,148,157 A | 9/1992 | Florence | |
| 5,278,949 A | 1/1994 | Thayer | |
| 5,340,700 A | 8/1994 | Chen et al. | |
| 5,393,987 A | 2/1995 | Abboud et al. | |
| 5,504,504 A | 4/1996 | Markandey et al. | |
| 6,201,545 B1 | 3/2001 | Wong et al. | |
| 6,261,728 B1 | 7/2001 | Lin et al. | |
| 6,285,488 B1* | 9/2001 | Sandstrom | 359/290 |
| 6,504,644 B1 | 1/2003 | Sandstrom et al. | |
| 6,605,816 B2 | 8/2003 | Sandstrom et al. | |
| 6,618,185 B2 | 9/2003 | Tanner | |
| 6,813,062 B2 | 11/2004 | Sandstrom et al. | |
| 6,833,854 B1 | 12/2004 | Sandstrom et al. | |
| 7,106,490 B2* | 9/2006 | Sandstrom | 359/290 |
| 7,186,486 B2 | 3/2007 | Walford et al. | |
| 2003/0107770 A1 | 6/2003 | Kiatchko et al. | |
| 2005/0053850 A1 | 3/2005 | Askebjer et al. | |
| 2005/0219502 A1* | 10/2005 | Sandstrom et al. | 355/77 |
| 2006/0068334 A1* | 3/2006 | Sandstrom et al. | 430/322 |

OTHER PUBLICATIONS

Newman, T. et al. "Evaluation of OPC Mask Printing with a Raster Scan Pattern Generator." Proceeding of SPIE. vol. 4691, Optical Microlithography XV, Jul. 2002, p. 1320-1330.

McCarthy, A.M. et al. "A Novel Technique for Detecting Lithographic Defects." IEEE Transactions on Semiconductor Manufacturing. vol. 1, No. 1, Feb. 1988, p. 10-15.

Rieger, M.L. et al. "Lithographic Alternatives to PSM Repair." Proceedings of SPIE, vol. 1674, Optical/Laser Microlithography V, 1992, p. 609-617.

Stephanakis, A.C. et al. "Advances in 1:1 Optical Lithography," Proceedings of SPIE, Optical Microlithography VI, vol. 772. p. 74-85 (1987).

Wolf, S. "Advanced Lithography," p. 493-513 in Silicon Processing for the VLSI Era - vol. 1: Process Technology, Lattice Press, Inc.m 1986.

* cited by examiner

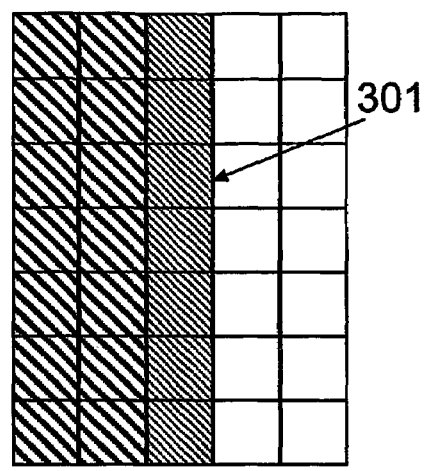
Fig3a Prior art
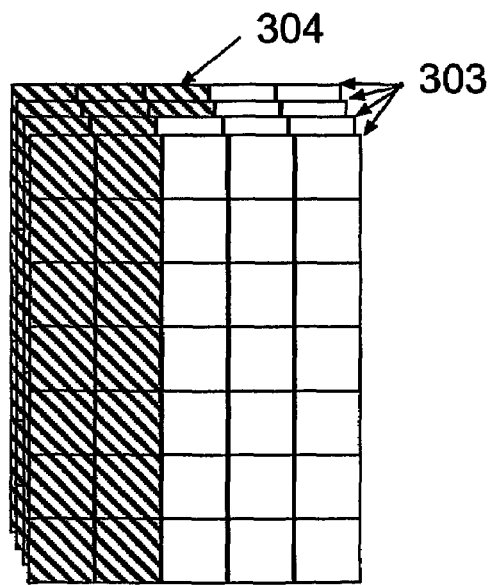
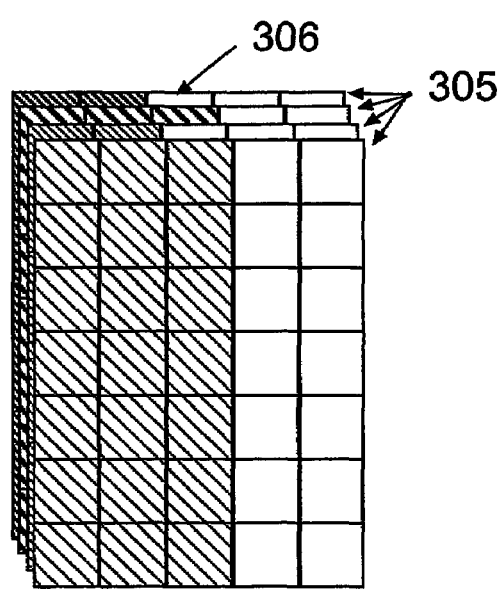
Fig3c Prior art
Fig3b Prior art

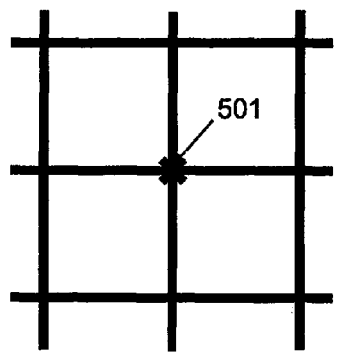
Fig 5a: Prior art
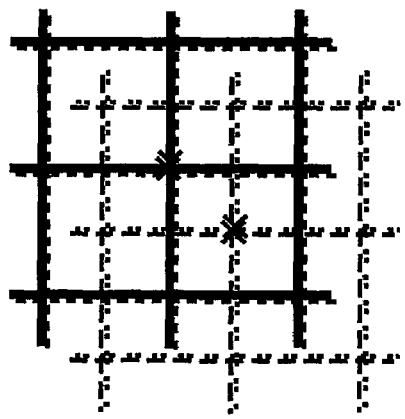
Fig 5b: Prior art
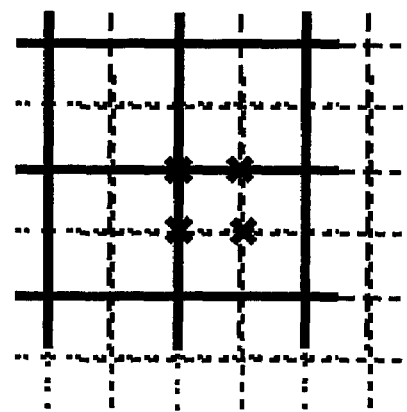
Fig 5c: Prior art

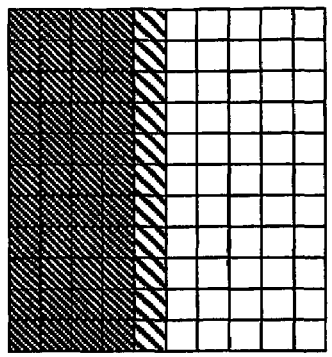
Fig. 12a
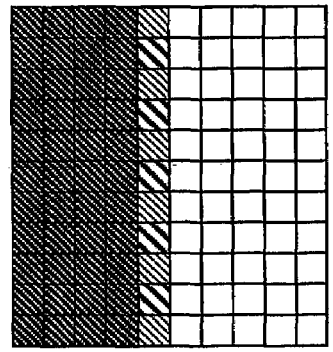 
Fig. 12b
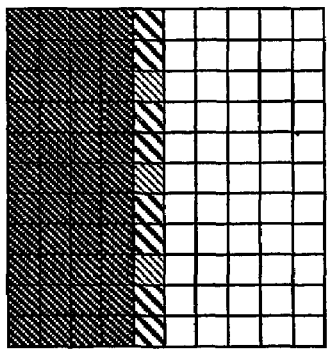 
Fig. 12c
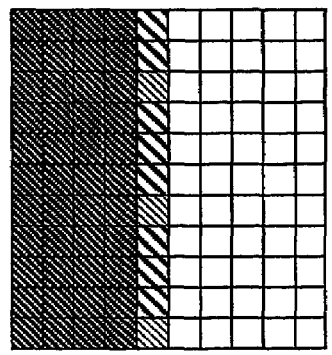 
Fig. 12d

| 3010 | 3011 | 3012 | 3013 | 3014 | 3015 | 3016 | 3017 |
|---|---|---|---|---|---|---|---|
| 0 | 0 | 75 | 100 | 100 | 74 | 0 | 0 |
| 0 | 0 | 74 | 100 | 100 | 75 | 0 | 0 |
| 0 | 0 | 75 | 100 | 100 | 74 | 0 | 0 |
| 0 | 0 | 74 | 100 | 100 | 75 | 0 | 0 |
| 0 | 0 | 75 | 100 | 100 | 74 | 0 | 0 |
| 0 | 0 | 74 | 100 | 100 | 75 | 0 | 0 |
| 0 | 0 | 75 | 100 | 100 | 74 | 0 | 0 |
| 0 | 0 | 74 | 100 | 100 | 75 | 0 | 0 |

Fig. 30

| 0 | 1 | 74 | 100 | 100 | 75 | 0 | 0 |
|---|---|----|-----|-----|----|---|---|
| 0 | 0 | 75 | 100 | 100 | 74 | 1 | 0 |
| 0 | 1 | 74 | 100 | 100 | 75 | 0 | 0 |
| 0 | 0 | 75 | 100 | 100 | 74 | 1 | 0 |
| 0 | 1 | 74 | 100 | 100 | 75 | 0 | 0 |
| 0 | 0 | 75 | 100 | 100 | 74 | 1 | 0 |
| 0 | 1 | 74 | 100 | 100 | 75 | 0 | 0 |
| 0 | 0 | 75 | 100 | 100 | 74 | 1 | 0 |

Fig. 31

| 0 | 0 | 75 | 100 | 100 | 75 | 0 | 0 |
|---|---|----|-----|-----|----|---|---|
| 0 | 0 | 74 | 99  | 99  | 74 | 0 | 0 |
| 0 | 0 | 75 | 100 | 100 | 75 | 0 | 0 |
| 0 | 0 | 74 | 99  | 99  | 74 | 0 | 0 |
| 0 | 0 | 75 | 100 | 100 | 75 | 0 | 0 |
| 0 | 0 | 74 | 99  | 99  | 74 | 0 | 0 |
| 0 | 0 | 75 | 100 | 100 | 75 | 0 | 0 |
| 0 | 0 | 74 | 99  | 99  | 74 | 0 | 0 |

Fig. 32

|  1:st  |  2:nd  |  3:rd  |  4:th  |
|--------|--------|--------|--------|
|   1    |   3    |   8    |   5    |
|   2    |   7    |   6    |   8    |
|   3    |   1    |   5    |   7    |
|   4    |   5    |   7    |   6    |
|   5    |   4    |   3    |   1    |
|   6    |   8    |   2    |   4    |
|   7    |   2    |   4    |   3    |
|   8    |   6    |   1    |   2    |

Fig. 34e

METHOD AND APPARATUS FOR PATTERNING A WORKPIECE

TECHNICAL FIELD

The present invention relates in general to techniques to obtain improved images. In particular it relates methods of lithography using a computer controlled imaging arrangement, such as for instance a Spatial Light Modulator (SLM), with an improved virtual grid. It also relates to an apparatus for patterning a work piece comprising such a method.

DESCRIPTION OF THE BACKGROUND ART

Lithographic production is useful for integrated circuits, masks, reticles, flat panel displays, micro-mechanical or micro-optical devices and packaging devices, e.g. lead frames and MCM's. Lithographic production may involve an optical system to image a master pattern from a computer-controlled reticle onto a workpiece. A suitable workpiece may comprise a layer sensitive to electromagnetic radiation, for example visible or non-visible light. An example of such a system is described in WO 9945435 with the same inventor and applicant as the present invention.

Said computer controlled reticle may for instance be a Spatial Light Modulator (SLM) comprising a one or two dimensional array or matrix of reflective movable micro mirrors; a one or two dimensional array or matrix of transmissive LCD crystals; or other similar programmable one or two dimensional arrays based on gratings effects, interference effects or mechanical elements, e.g. shutters.

Generally speaking pattern quality may be improved by multipass writing. However, there are several different aspects of the pattern quality that are improved by multipass writing, but not necessarily at the same time. First, it is possible to create a finer address grid in several passes than in one single pass. Second, multiple passes with offset grid can remove the grid effects due to the finite pixel size.

Third, random errors (such as artifacts in the light path, noise in the exposure dose, misplacement of beam or field used for imaging) are statistically reduced by multiple passes, e.g., four passes reduces the effects of random dose errors by a factor of two (square root of four). Fourth, systematic errors (such as dose fall of in corners of the image to be written, distortion and focal plane curvature) can be reduced by offset between the writing fields. Fifth, with multiple writing passes it is possible to better correct for bad pixels. Sixth, many multipass schemes give a softening of the edges, and retention of edge acuity is a desirable property of a multipass scheme.

Different rasterizing multipass schemes can be devised, but it is a problem to find schemes that simultaneously give improvements in all six aspects mentioned above.

FIG. 3a illustrates a known method for creating a virtual grid. In FIG. 3a it is shown an array of seven lines and 5 columns of pixels. Pixels in the two leftmost columns are set to a maximum grayscale value. Pixels in the two rightmost columns are set to minimum grayscale value. Pixels in a middle column are set to an intermediate grayscale value. FIG. 3a is an example of analog modulation of feature edge pixels 301 in a single pass in order to create a virtual grid. All pixels in said middle column are set to the same value.

FIG. 3b illustrates another known method for creating a virtual grid. In this method four writing passes 305 are written with binary doses (e.g. 100%, 50%, 25%, 12,5%). All pixels in one single pass are set to equal grayscale values. The virtual grid is created by turning on a column of feature edge pixels in at least one writing pass, in FIG. 3b columns of feature edge pixels are turned on in the top writing pass and the second writing pass from bottom.

FIG. 3c illustrates yet another known method for creating a virtual grid. In this method all four writing passes 305 are written with the same dose. In at least one pass a column 304 of feature edge pixels are turned on, illustrated in FIG. 3c to be the bottom writing pass and the second writing pass from the bottom.

FIG. 4a illustrates another known method for creating a virtual grid. In this method four 401 passes are written offset with equal dose. The different writing passes are illustrated in FIG. 4a to be offset relative to an origin 402. By turning on edge pixels 403 in only some passes an edge of a feature to be written can be fine positioned.

FIG. 4b illustrates still another known method for creating a virtual grid. This method utilizes a combination of the analog modulation of feature edge pixels with offset passes which gives a different analog value 404 in each pass.

FIG. 5a illustrates a writing grid of four pixels in a single pass writing strategy. A reference mark denoted with 501 is arranged in middle of the grid.

FIG. 5b illustrates a known method for offsetting different writing passes. Here four passes are used where two of them are offset relative to the other two by a distance defined by a half pixel size in two orthogonal directions parallel with the pixel grid. By offsetting different writing passes in a multiple writing strategy different imaging defects can more or less effectively be hidden.

FIG. 5c illustrates another known method for offsetting different writing passes in order to hide the grid. In this embodiment all writing passes are offset relative to each other. One writing pass is offset in a first direction only, another writing pass is offset in a second direction, orthogonal to said first direction, and one writing pass is offset in sad first and sad second direction simultaneously. The offset in said first and said second direction is illustrated to be half a pixel size.

It is in a general sense possible to make pattern fidelity better by increasing the number of passes, but the cost is high. Doubling the number of passes doubles the capital and operating cost of the pattern generator per produced workpiece and can in many cases be economically impossible.

In general, computer controlled reticles may be used for the formation of images in a variety of ways. These reticles, such as an SLM, include many modulating elements or pixels, in some instances, a million or more pixels.

In WO 99/45440, with one common inventor to the present application, is described a pattern generator with improved address resolution. In said application the pixels can be set in a number of states, larger than two, with one type of pixel map inside pattern features, another type of pixel map outside pattern features and intermediate pixel maps at a boundary of pattern features. The intermediate pixel map is generated in dependence of the placement of the boundary in a grid finer than that of pixels of the SLM projected onto the workpiece.

Due to the fact that the line width and a space between two lines in the pattern to be printed on the wafer are very small, it puts a lot of demands on the printing method and the apparatus using said method. Using an SLM, which provides for a too coarse address grid may limit the resolution and accuracy available for their use in optical imaging; e.g., the production of printed patterns on a workpiece may be limited as to its line widths and accuracy.

Therefore, there is a need in the art for a method, which further fine-adjust the position of the element's edge in the image created on the workpiece. There is also a need in the art for an improved effectiveness of multipass averaging, i.e., reduced number of passes giving an improved fine-adjustment of a feature edge.

SUMMARY OF THE INVENTION

In view of the foregoing background, the fine adjustment of the position of the element's edge in the image created on the workpiece is critical for accomplishing line width in the range of sub-micrometers both when using single pass or multiple pass writing strategy.

The present invention applies to patterning a workpiece based on a digital input data file, such as the writing of masks, semiconductor wafers, optoelectronic devices, micro optical devices, magnetic devices, super conducting devices, display devices, and electronic interconnect structures such as MCMs. The invention is independent of the mechanism of writing and applies to laser and other electromagnetic beams, electron and other charged particle beams. Beam is to be understood broadly so that printing methods that uses projected areas such as SLMs, cell projection are also included. Non conventional writing mechanism are also included, such as atom beams, multi photon processes, entangled photons, near field effects, direct current exposure from scanning probes and thermal exposure.

Accordingly, it is an object of the present invention to provide an improved method for fine adjustment of the element's edge.

In a first embodiment, the invention provides a method for creating a pattern on a workpiece sensitive to electromagnetic radiation. Electromagnetic radiation is emitted onto a computer-controlled reticle having a multitude of modulating elements (pixels). The pixels are arranging in said computer controlled reticle according to a digital description. An image is created of said computer controlled reticle on said workpiece, wherein said pixels in said computer controlled reticle are arranged in alternate states along at least a part of one feature edge in order to create a smaller address grid.

In another embodiment of the invention said pixels in said computer controlled reticle along at least one feature edge belong to a one-dimensional line of pixels.

In still another embodiment of the invention said image is created in one writing pass.

In yet another embodiment of the invention said image is created by means of a plurality of writing passes.

In a further embodiment of the invention said pixels in said computer controlled reticle along at least one feature edge are arranged differently in said plurality of writing passes.

In another embodiment of the invention, in a first writing pass, at least a first pixel along at least one feature edge is set to a first grayscale value and surrounded with pixels set to at least one other gray scale value, and in at least one other writing pass at least a second pixel along said at least one feature edge is set to said first grayscale value with surrounding pixels set to at least one other gray scale value.

In still another embodiment of the invention four writing passes create the pattern.

In still another embodiment of the invention the pixels in the different writing passes set to said first grayscale value are non overlapping.

In still another embodiment of the invention said surrounding pixels are set to the same grayscale value.

In still another embodiment of the invention said surrounding pixels are set to the different grayscale values.

In still another embodiment of the invention said pixels in said computer controlled reticle along at least one feature edge belong to a line of pixels with a width of two pixels.

In still another embodiment of the invention said pixels in said computer controlled reticle along at least one feature edge belong to a lines of pixels with a width of three pixels.

In still another embodiment of the invention said pixels are micromirrors in an SLM.

In another embodiment of the invention said pixels are transmissive.

Another aspect of the present invention is to provide an improved apparatus for fine adjustment of the element's edge.

In a first embodiment, the invention provides an apparatus for creating a pattern on a workpiece sensitive to electromagnetic radiation. Said apparatus comprising a source to emit electromagnetic radiation onto a computer controlled reticle having a multitude of modulating elements (pixels), a projection system to create an image of said computer controlled reticle on said workpiece, wherein said pixels in said computer controlled reticle are arranged in alternate states along at least a part of a boundary of at least one element to be patterned, in order to fine-adjust the position of an edge of said element in said image to be created on the workpiece.

In a first embodiment of the invention said pixels in said computer controlled reticle along at least one feature edge belong to a one-dimensional line of pixels.

In another embodiment of the invention said image is created in one writing pass.

In still another embodiment of the invention said image is created by means of a plurality of writing passes.

In still another embodiment of the invention said pixels in said computer controlled reticle along at least one feature edge are arranged differently in said plurality of writing passes.

In still another embodiment of the invention, in a first writing pass, at least a first pixel along at least a part of one feature edge is set to a first grayscale value and surrounded with pixels set to at least a second gray scale value, and in at least a second writing pass at least a second pixel along said part of said feature edge is set to said first grayscale value with surrounding pixels set to at least said second gray scale value.

In yet another embodiment of the invention the pattern is created by four writing passes.

In yet another embodiment of the invention said pixels set to say first grayscale value in the different writing passes are non-overlapping.

In still another embodiment of the invention said pixels set to said first grayscale value in the different writing passes are spaced apart with at least one pixel.

In still another embodiment of the invention said surrounding pixels are set to the same grayscale value.

In still another embodiment of the invention said surrounding pixels are set to the different grayscale values.

In still another embodiment of the invention said pixels in said computer controlled reticle along at least a part of one feature edge belong to a line with a width of two pixels.

In another embodiment of the invention said pixels in said computer controlled reticle along at least one feature edge belong to a line with a width of three pixels.

In another embodiment of the invention said pixels are micromirrors in an SLM.

In another embodiment of the invention said computer controlled reticle is a transmissive SLM.

Another aspect of the present invention is to provide an improved wafer, which is patterned with a finer address grid.

In a first embodiment the invention provides a semi-conducting wafer comprising at least one integrated circuit, wherein said at least one integrated circuit is patterned by means of electromagnetic radiation emitted onto a computer controlled reticle having a multitude of modulating elements (pixels) in at least one writing pass, said pixels in said computer controlled reticle is arranged according to a digital description, an image of said computer controlled reticle is created on said wafer, wherein said pixels in said computer controlled reticle are arranged in alternate states along at least a part of one feature edge in order to create a smaller address grid.

Another aspect of the present invention is to provide an improved mask, which is patterned with a finer address grid.

In a first embodiment the invention provides a mask comprising a pattern to be printed on a workpiece, wherein a mask substrate is patterned in at least one writing pass by means of electromagnetic radiation emitted onto a computer controlled reticle having a multitude of modulating elements (pixels), said pixels in said computer controlled reticle is arranged according to a digital description, an image of said computer controlled reticle is created on said mask substrate, wherein said pixels in said computer controlled reticle are arranged in alternate states along at least a part of one feature edge in order to create a smaller address grid.

Another aspect of the present invention is to provide an improved method for fine adjustment of an element's edge to be imaged.

In a first embodiment the invention provides a method for imaging a pattern on a surface based on a description in a data file, where multiple writing passes is provided, a grid of pixels in at least two passes is offset, the values of edge pixels in the different passes are controlled, and the values of edge pixels between at least two passes are coordinated by a predetermined rasterizing rule so that the edge quality is optimized.

In another embodiment of the invention, said edge quality is defined to be edge roughness.

In another embodiment of the invention, said edge quality is defined to be edge acuity.

In another embodiment of the invention said edge quality is defined to be critical dimension control (CDC).

In another embodiment of the invention said at least two adjacent edge pixels in at least one pass have unequal values.

In another embodiment of the invention, said rasterizing is non-linear.

In another embodiment of the invention said dividing each pixel in at least two areas where a first area has a first weight function performs non-linear rasterizing and a second area has a second weight function.

Another aspect of the present invention is to provide a method for creating a virtual grid.

In a first embodiment the invention provides a method for writing a pattern on a substrate based on a description in a data file and to create a virtual grid, where a sequence of feature edge pixels is generated in a first writing pass, said sequence of feature edge pixels is displaced in at least a second writing pass, said sequences are at least partly superposed on said substrate.

In another embodiment said invention further comprising the action of offsetting a grid of pixels in at least two passes.

In another embodiment said invention further comprising the action of repeating said sequence of feature edge pixels periodic along at least one feature edge.

In another embodiment of the invention, said sequence of feature edge pixels is non periodic.

Another aspect of the present invention is to provide a further method for creating a virtual grid.

In a first embodiment the invention provides a method for writing a pattern on a substrate based on a description in a data file and to create a virtual grid, wherein a first sequence of feature edge pixels is generated in a first writing pass, a second sequence of feature edge pixels is generating in at least a second writing pass, said sequences are at least partly superposing on said substrate.

In another embodiment of the invention, said first and second sequences are periodic.

In another embodiment of the invention, said first and second sequences are non-periodic.

In another embodiment of the invention, said pixels are on/off pixels.

In another embodiment of the invention, said pixels are multi-valued pixels.

In another embodiment said invention further comprising the action of offsetting a grid of pixels in at least two passes.

In another embodiment of the invention, said at least one of said feature edge pixels is divided into at least two regions having different weight functions for accomplishing non-linear rasterizing.

BRIEF DESCRIPTION OF THE DRAWINGS

For a more complete understanding of the present invention, and the advantages thereof, reference is now made to the following description taken in conjunction with the accompanying drawings, in which:

FIG. 3a illustrates a first embodiment according to prior art for creating a virtual grid.

FIG. 3b illustrates a second embodiment according to prior art for creating a virtual grid.

FIG. 3c illustrates a third embodiment according to prior art for creating a virtual grid.

FIG. 5a illustrates a first embodiment according to prior art for creating pass offsets.

FIG. 5b illustrates a second embodiment according to prior art for creating pass offsets.

FIG. 5c illustrates a third embodiment according to prior art for creating pass offsets.

FIG. 6b illustrates the result of printing a star using the offset according to FIG. 6a.

FIG. 12a-e illustrates the result of single pass feature edge pixel sequences.

FIG. 30 illustrates another embodiment of an inventive feature edge pattern in a Spatial Light Modulator (SLM).

FIG. 31 illustrates yet another embodiment of an inventive feature edge pattern in a Spatial Light Modulator (SLM).

FIG. 32 illustrates still another embodiment of an inventive feature edge pattern in a Spatial Light Modulator (SLM).

FIG. 34e illustrates a writing pass scheme in an embodiment of four writing passes and a pixel sequence length of eight pixels.

DETAILED DESCRIPTION OF THE PREFFERED EMBODIMENTS

Figure 1A:
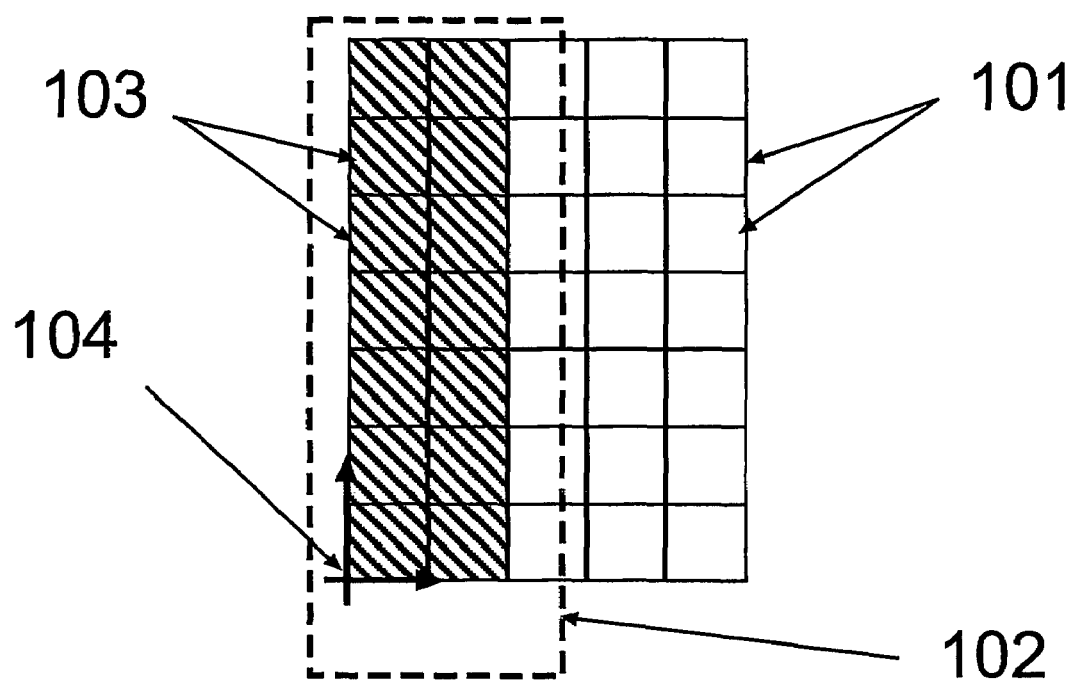
FIG. 1a illustrates a first way of rasterizing a feature using a single writing pass.

FIG. 1a illustrates a rasterized feature 102. A grid 101 comprising pixels 103 is aligned to an origin 104 of a coordinate system. From FIG. 1a one can see that the grid is somewhat to coarse Therefore the feature 102 may not be imaged as accurate as desired.

Figure 1B:
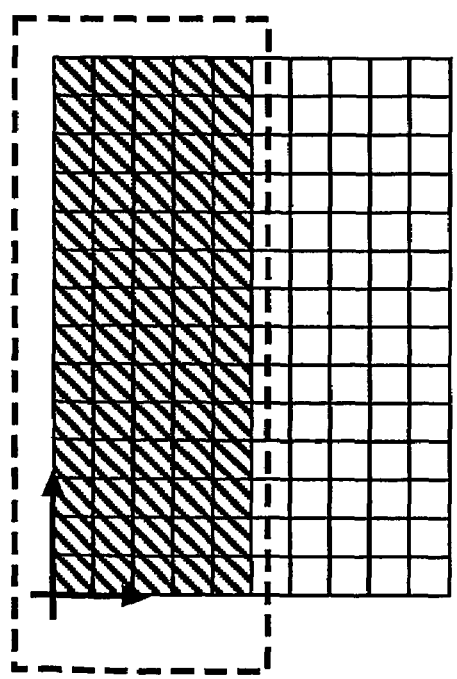
FIG. 1b illustrates a second way of rasterizing a feature using a single writing pass.

FIG. 1b illustrates the same feature as shown in FIG. 1a, but here the feature is rasterized to a finer grid. The accuracy of the rasterizing is two times better, but there are four time more pixels to write, which may make this method more time consuming relative the one illustrated in FIG. 1a.

Figure 1C:
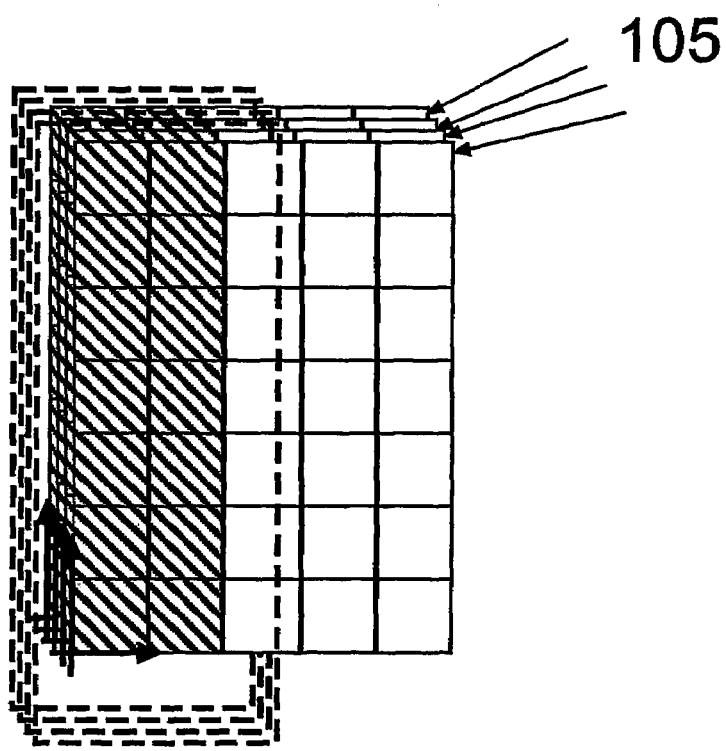
FIG. 1c illustrates a third way of rasterizing a feature using four writing passes.

FIG. 1c illustrates the same feature as shown in FIG. 1a rasterized to the same grid size but using four passes 105 with no offset. Different lithographical characteristics such as resist properties and time delays may make this method of imaging more accurate than the one illustrated in FIG. 1a given that the different passes are imaged with equal doses.

Figure 2A:
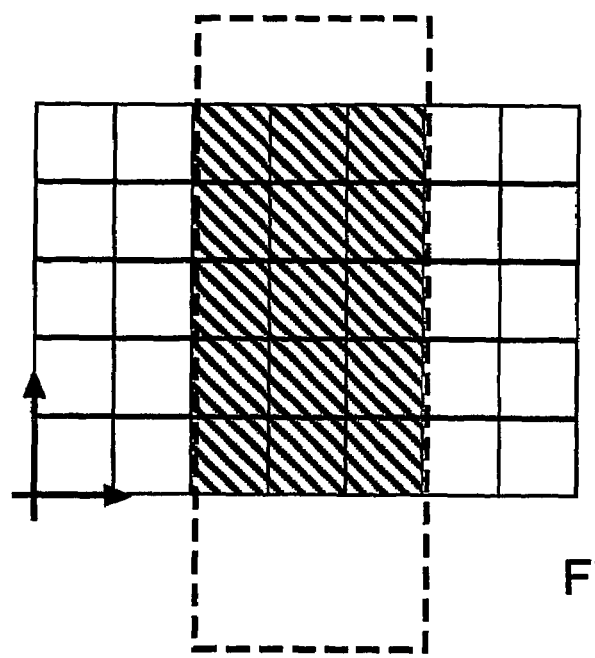
FIG. 2a illustrates a rasterized feature.
Figure 2B:
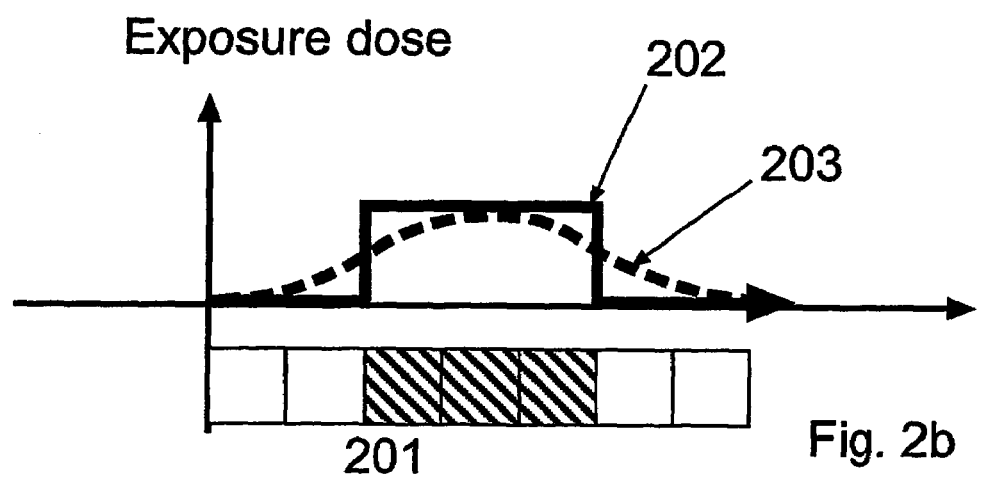
FIG. 2b illustrates an exposure dose as a function of individual pixels.
Figure 2C:
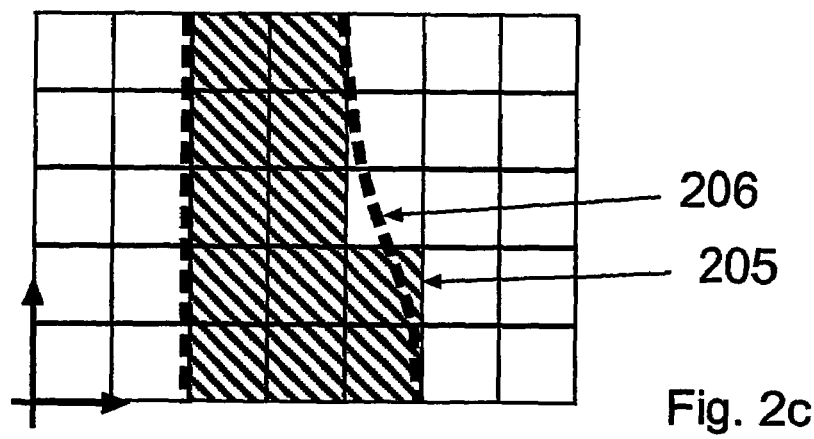
FIG. 2c illustrates a smoothening of an edge.
Figure 4A:
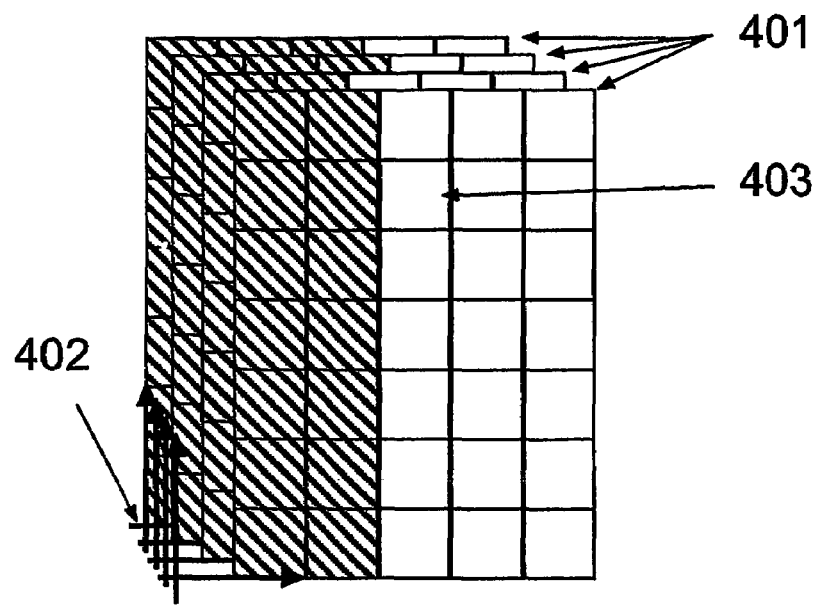
FIG. 4a illustrates a fourth embodiment according to prior art for creating a virtual grid.
Figure 4B:
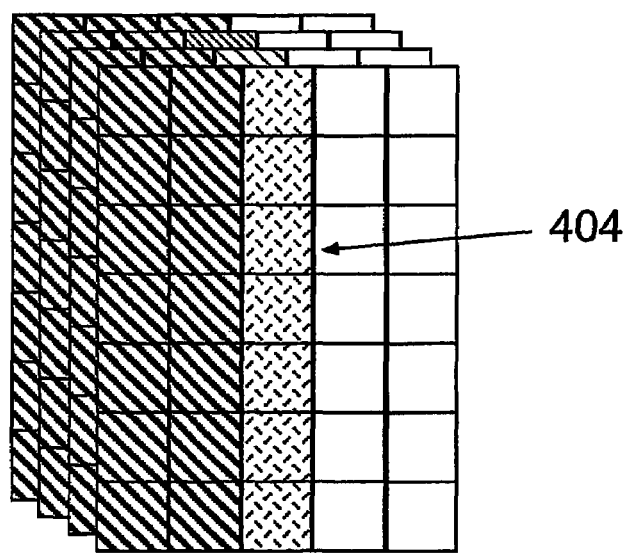
FIG. 4b illustrates a fifth embodiment according to prior art for creating a virtual grid.

FIG. 2a illustrates a rasterized vertical line. FIG. 2b illustrates an ideal exposure 202 of the rasterized line in FIG. 2a. Smoothing by a finite resolution of an exposure beam gives an exposure dose denoted by 203 in FIG. 2b. FIG. 2b shows the smoothening by the exposure, but chemical diffusion, developer transport and finite resolution of the resist or recording medium also gives a similar effect. FIG. 2c illustrates a rasterized feature comprising a step. The imaged feature will end up with a pattern illustrated by the dashed line. The smoothening of step 205 is caused by the finite resolution of the exposure beam according to what was described in connection with FIG. 2b. Pixel 206 will therefore receive contribution from adjacent pixels.

Figure 6A:
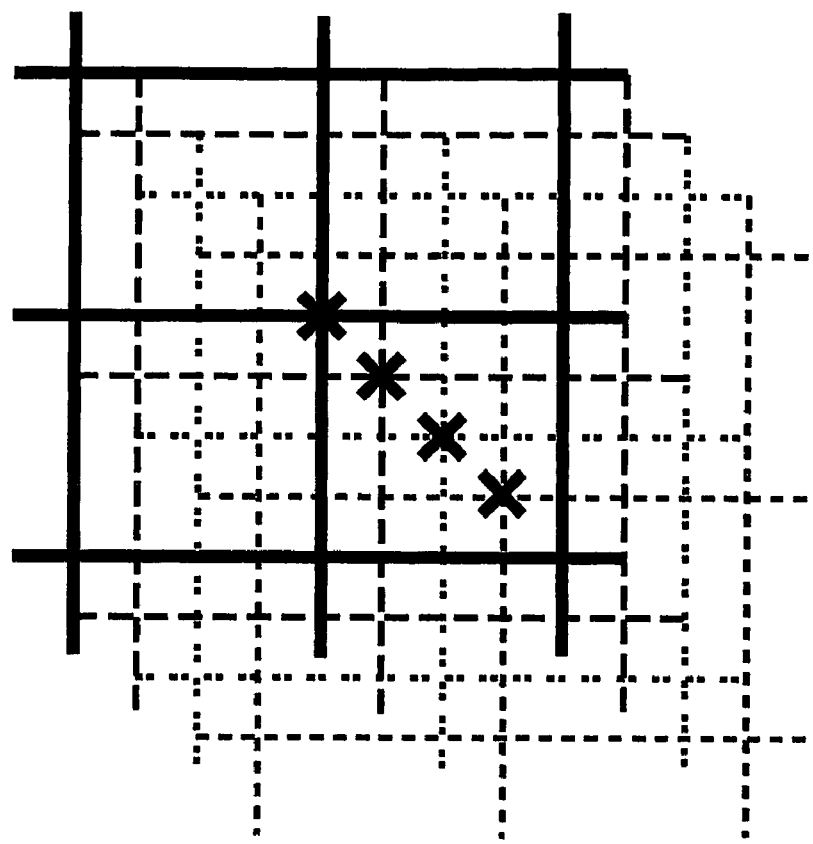
FIG. 6a illustrates a first embodiment according to the present invention offsetting different writing passes.

FIG. 6a illustrates an inventive method for offsetting different writing passes. In this embodiment four writing passes are offset relative to each other by a quarter of a pixel size in two orthogonal directions. The passes are here illustrated to be offset along a diagonal line of the pixel. Generally with N passes, where N is an integer greater than two, passes are distributed along a diagonal line of a pixel by (pixel size)/N, i.e., with three writing passes a first pass is written in a origin of coordinates, a second pass is written ⅓ of a diagonal line of a pixel away from said origin of coordinates and a third pass is written ⅔ of a diagonal line of a pixel away from said origin of coordinates.

Figure 6B:
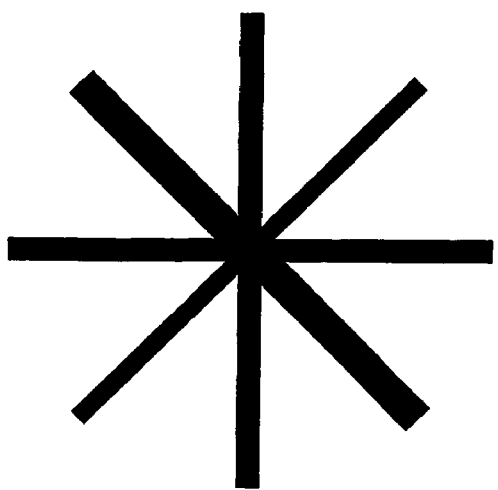

FIG. 6b illustrates a star written by said offset method as illustrated in FIG. 6a. It can be seen from FIG. 6b that there exists an unwanted asymmetry in the diagonals. This is caused by the fact that smoothening only occurs in directions parallel with pixel sides but in directions deviating from that one will see coarse grid effects.

Figure 6C:
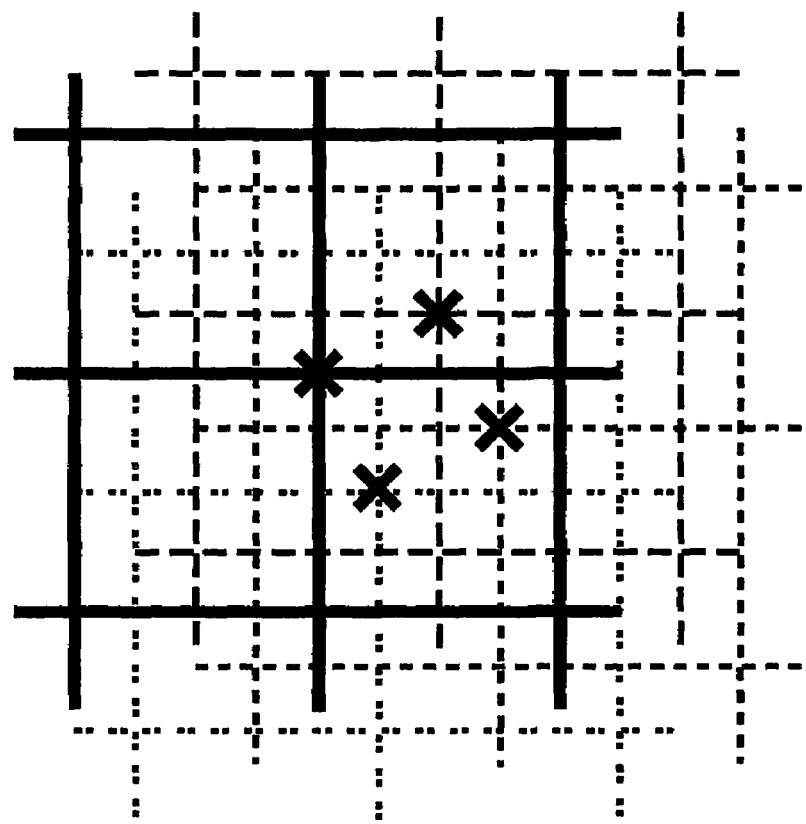
FIG. 6c illustrates a second embodiment according to the present invention for creating pass offsets.

FIG. 6c illustrates another inventive method for offsetting different writing passes. In this embodiment four writing passes are distributed by the same amount but not along a straight line as illustrated in FIG. 6a. Here a first pas is written in an origin of coordinates. A second pass ¼ of a pixel size in an x direction and ½ of a pixel size in a negative y direction, x and y directions are parallel with the sides of the rectangular pixels. A third pass is written ½ the pixel size in the x direction and ¼ of the pixel size in the y direction. A fourth pass is written ¾ of the pixel size in the x direction and ¼ of the pixel size in the negative y direction. By this offsetting method you will obtain symmetry in both directions parallel to the sides of the pixel and also in both diagonals of said pixels.

Figure 6D:
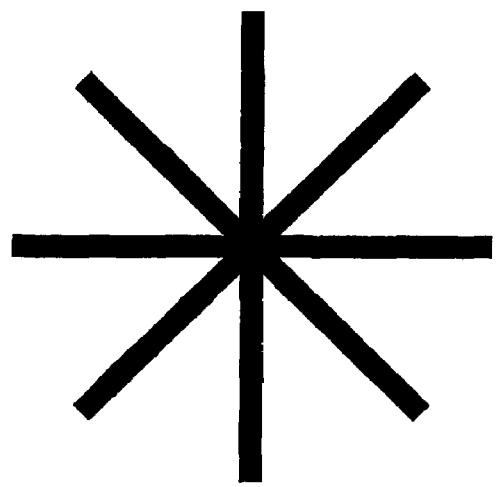
FIG. 6d illustrates the result of printing a star using the offset according to FIG. 6c.

FIG. 6d illustrates the same star written by the method according to FIG. 6c. Here the symmetry is improved compared to the star in FIG. 6b. By offsetting the writing passes according to the scheme illustrated in FIG. 6c symmetry is accomplished in all eight directions.

Figure 7:
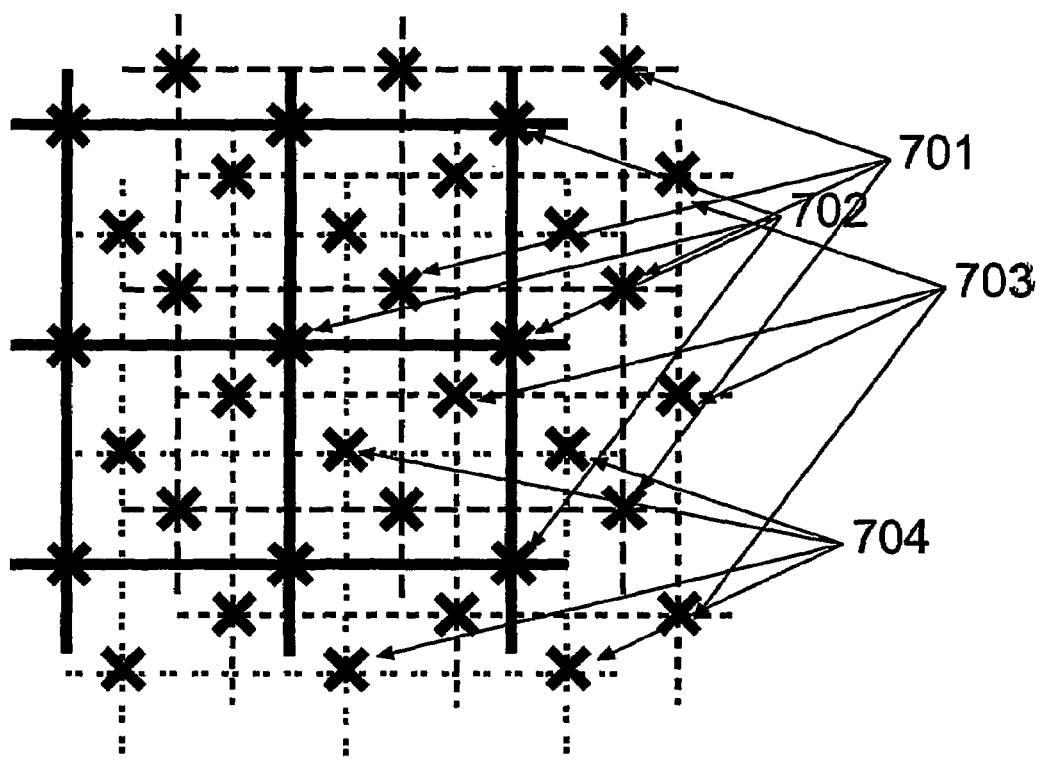
FIG. 7 illustrates reference points using four writing passes according to the present invention.

FIG. 7 illustrates reference points for several pixels in four passes 701, 702, 703, 704. It is possible to modify the displacement between the passes slightly by a small fraction of a pixel size unit to get a more uniform distribution of the reference points at the expense of a non-uniform division along the horizontal and vertical axis. The details of the rasterizer algorithm and the error structure of the pattern generator determine which is more favorable. Mirror images of the pattern in FIG. 7 and 90 degrees rotation of it will be equally good. The offsetting method according to FIG. 7 is particularly good for hiding a grid pattern. You may of course use another number of passes, in such case the pattern will look differently. The offset between the passes should be chosen so that one will get as good symmetry in x and y directions and both diagonals as possible.

Figure 8:
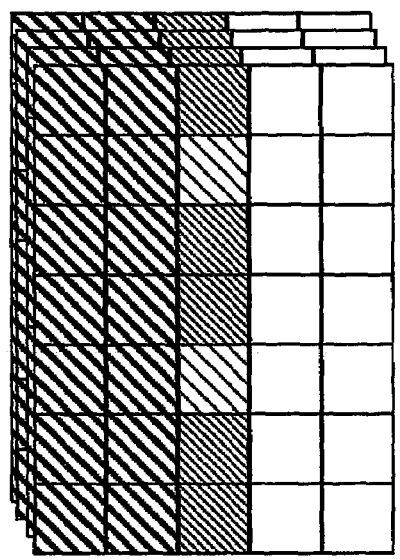
FIG. 8 illustrates a first embodiment of a four pass writing strategy according to the present invention.

FIG. 8 illustrates four writing passes according to the invention with analog or multi-valued pixels. A middle column, represent a feature edge pixel column. As can be seen pixels in said column are set to different states. The pattern of the pixels in the feature edge column in the four passes could be equal or unequal. A finer address grid is accomplished by dithering between different grayscale values.

Figure 9:
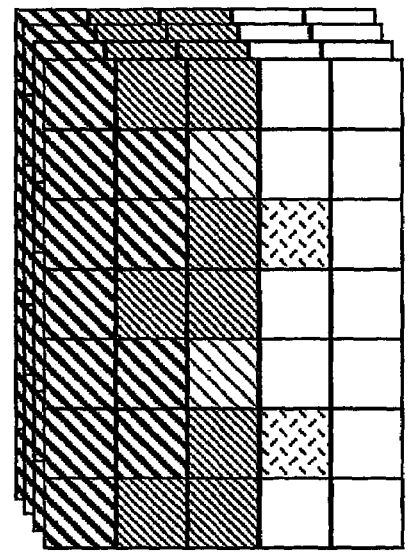
FIG. 9 illustrates a second embodiment of a four pass writing strategy according to the present invention.

FIG. 9 illustrates four passes according to the invention with edge pixels in more than one column. The pixels are multi-valued. Here again the plurality of edge columns in one writing pass could be equal or unequal in at least one other writing pass. Pixels in different edge columns may have different weights, which may be set differently from one case to another depending for instance which pattern is to be imaged.

Figure 10:
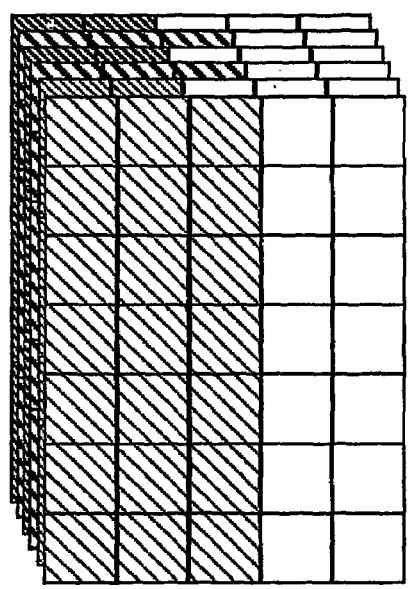
FIG. 10 illustrates a third embodiment of a four pass writing strategy according to the present invention.

FIG. 10 illustrates a multipass scheme according to the invention. Here, passes with different dose create a fine address grid, with some passes, typically those with high dose, doubled in order to improve averaging. The passes with the same dose, in FIG. 10 denoted with the same crosshatch, can have their exposure fields and/or their pixel grid displaced in order to improve image uniformity. Writing passes with high doses are repeated due to the fact that averaging will have most impact from those passes. Passes with the lower doses may mainly be used for fine adjusting the address grid. Passes with higher dose are used for the most significant bits in the address and passes with lower dose are used for the least significant bits in the address.

Figure 11A:
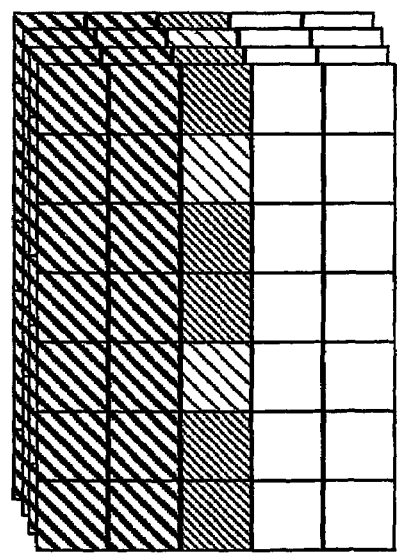
FIG. 11a illustrates a fourth embodiment of a four pass writing strategy according to the present invention.
Figure 11B:
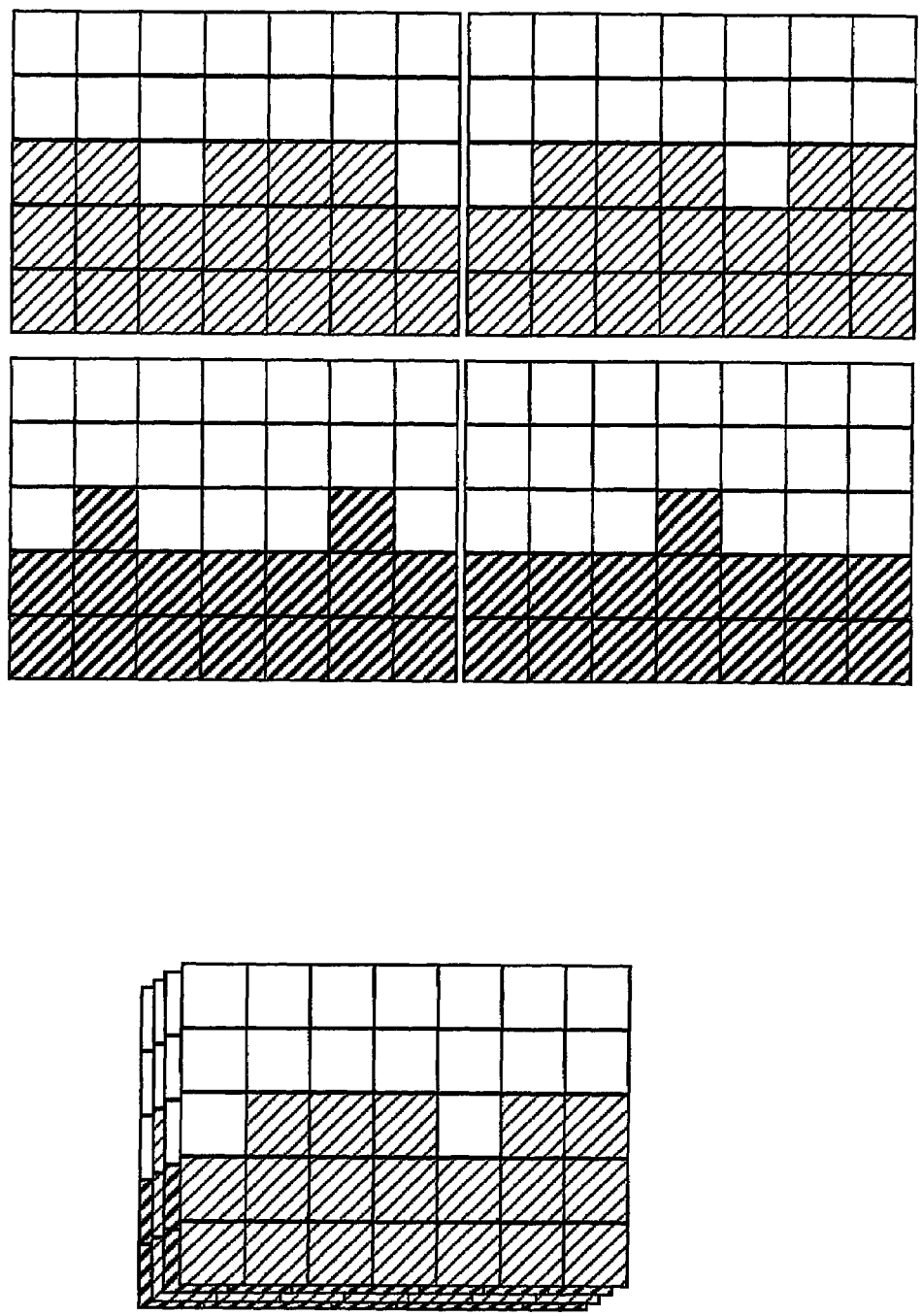
FIG. 11b illustrates a fifth embodiment of a four pass writing strategy according to the present invention.

FIG. 11a and 11b illustrate multipass schemes according to the invention with edge pixels to create a finer grid and edge pixel sequence or distribution in different passes being different. In FIG. 11a the different passes are written with essentially the same exposure. In FIG. 11b two passes are written with for example 25% exposure and the other two with 100% exposure. The period of sequence in each pass is four, giving a combined grid of 1/16 of the pixel size. An example of an edge pixel sequence is illustrated to the right of the superposed passes in FIG. 11b. The two leftmost patterns may be written by 100% exposure and the two rightmost patterns may be written by 25% exposure.

Figure 12E:
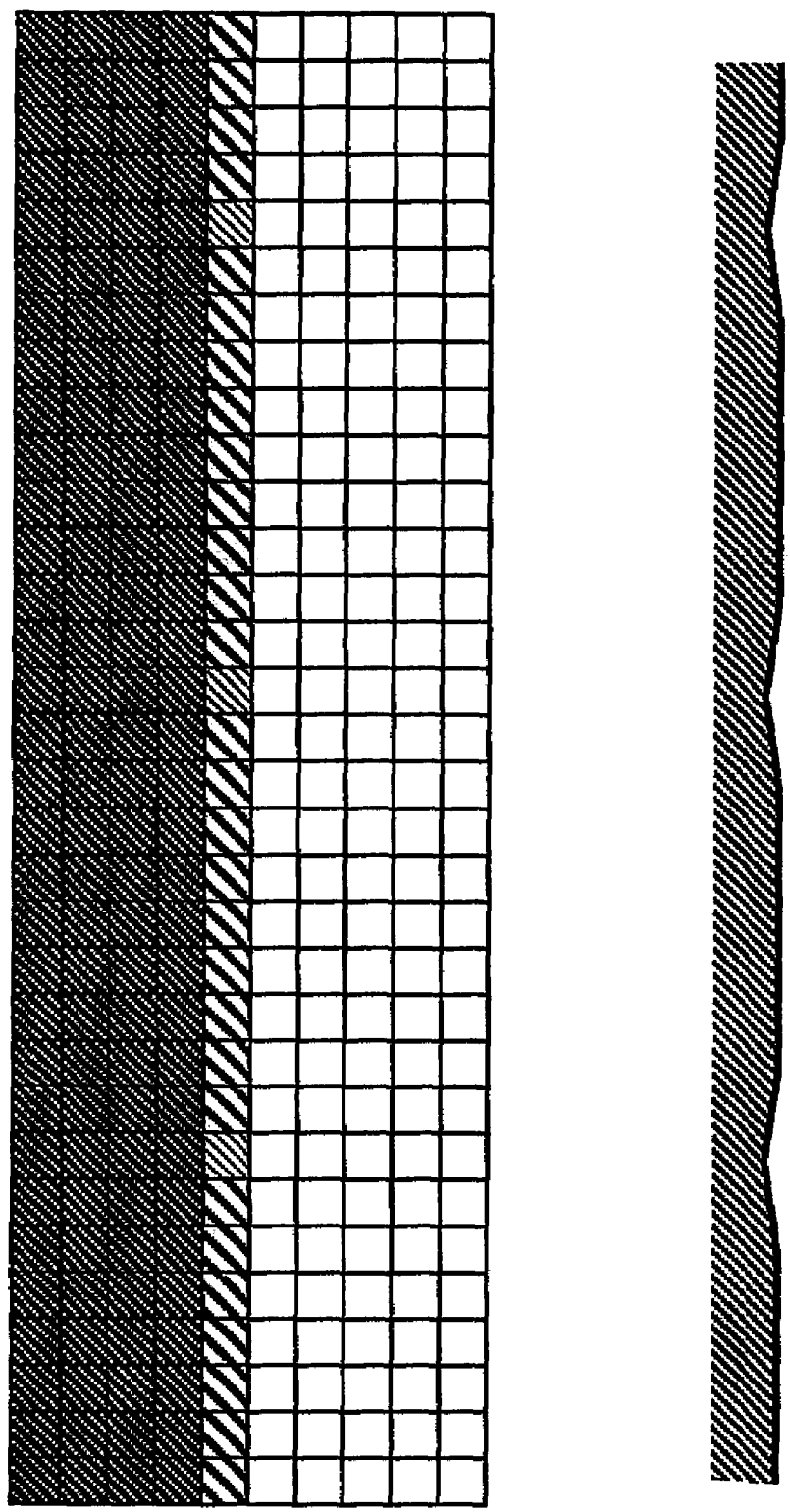

FIG. 12a-e illustrates different edge pixel sequences. Edge pixel sequences may be periodic or non-periodic. The figures show periodic sequences with different periods and a resulting image edge. FIG. 12a illustrates a pixels sequence with period 1, i.e., all pixels have the same value. Clearly this will create a smooth edge.

FIG. 12b depicts a pixel sequence with period two, giving a virtual address grid two times finer than in FIG. 12a. The edge is still smooth due to the smoothening function of the exposure tool and process. The pixels are analog with for example 16 states and every second pixel at the feature edge may for example be set at 5/16 and the rest to 6/16.

FIG. 12c illustrates a pixel sequence with period three, giving three times finer grid but starting to show line edge roughness (LER). The actual edge roughness depends on the trade off between pixel size, and the figure shows a typical example.

FIGS. 12d and 12e illustrates a pixel sequence of 4 and 10 respectively. In those two figures one can clearly see that the edge roughness increases with increased pixel sequence period.

Figure 13:
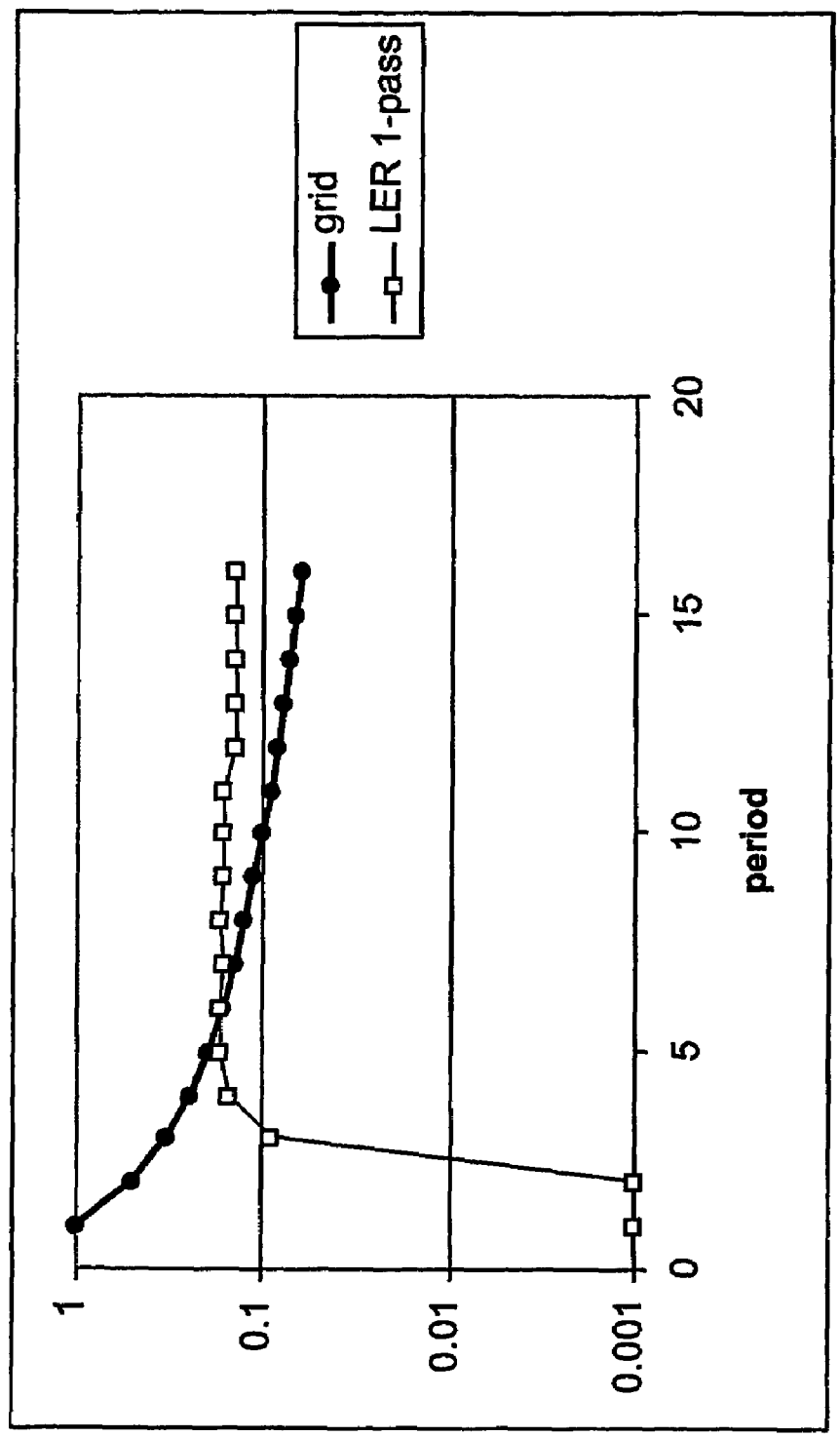
FIG. 13 depicts a graph showing the relation between virtual grid and line edge roughness.

FIG. 13 depicts a graph showing the relation between virtual grid and line edge roughness using the scheme in FIG. 12. Both virtual grid and edge roughness are in relative to the pixel size.

Figure 14:
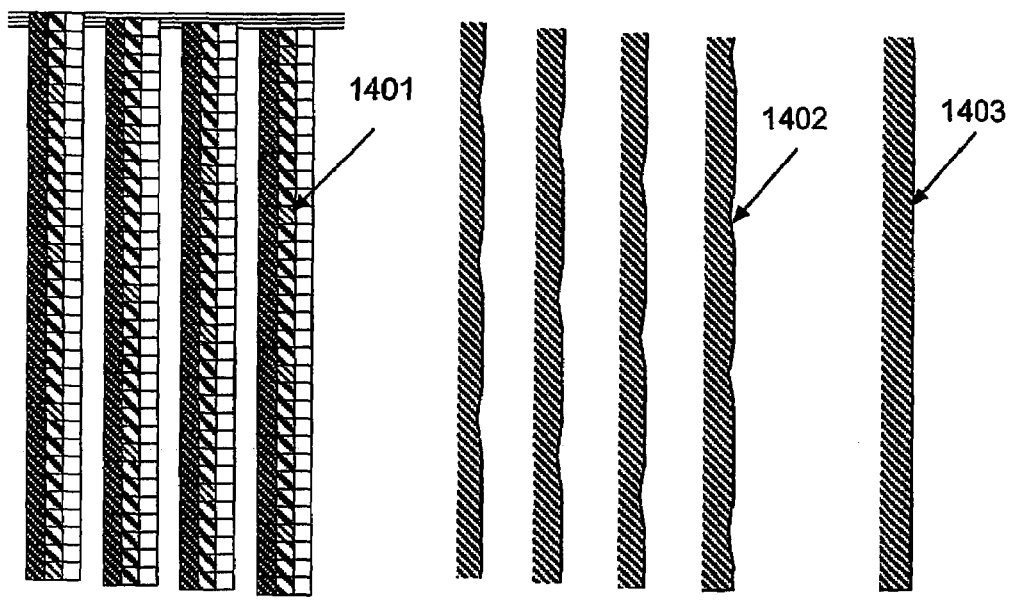
FIG. 14 illustrates four writing passes with a long feature edge pixel period according to the invention.

FIG. 14 illustrates four passes with a long edge pixel period 1401. Each pass taken alone will create a strong line edge roughness 1402. By displacing the pattern a number of pixels between the passes and superposing the passes will reduce the line edge roughness 1403 strongly.

Figure 15:
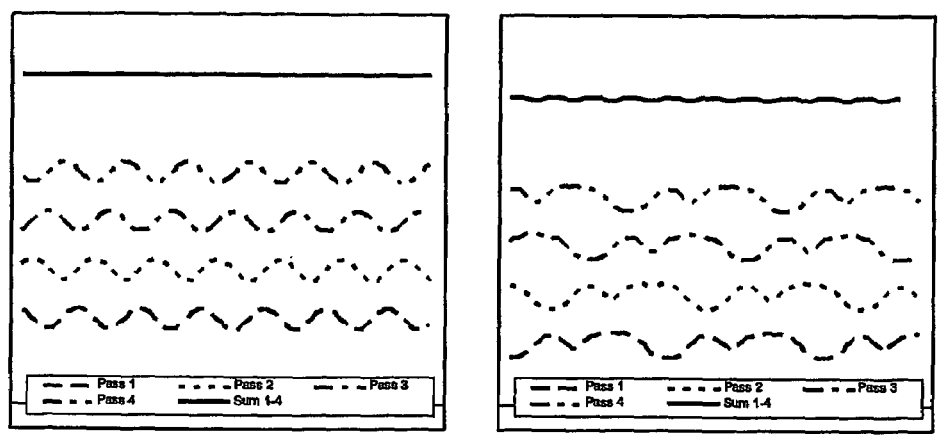
FIG. 15 depicts a graph showing the simulated edge roughness for each pass and the combined roughness.

FIG. 15 illustrates two graphs showing the simulated edge roughness for each pass and the combined roughness. The two graphs show two different sequences corresponding to different placement of the feature edge. The graphs show that some placements are better and some are worse, but for every placement a large reduction of the roughness is possible. The left graph in FIG. 15 illustrates displacement of a regular pixel edge pattern and the right graph shows superposition of irregular pixel edge patterns.

Figure 16:
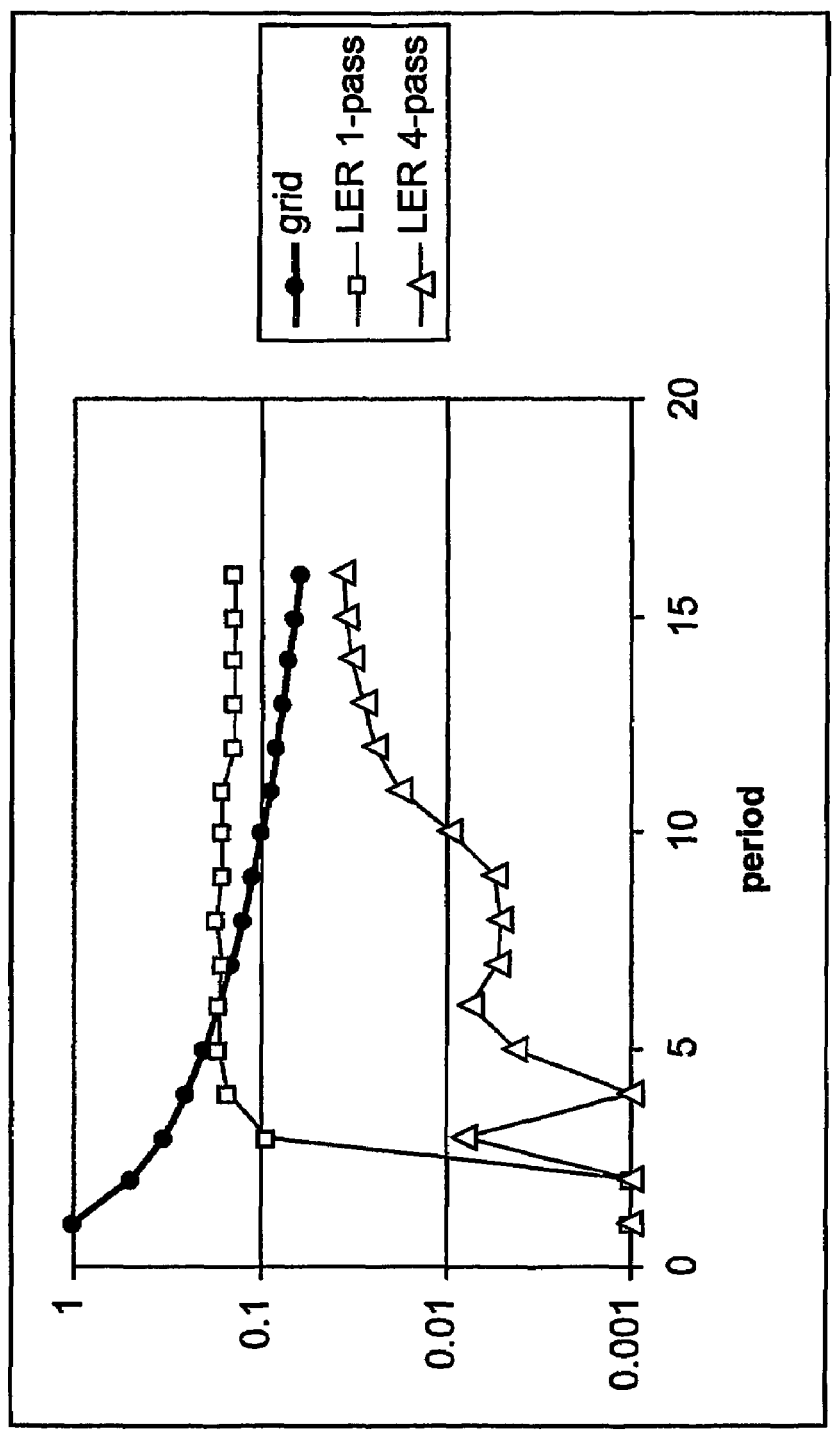
FIG. 16 depicts the same graph as in FIG. 13 but with the edge roughness after four passes with displaced edge pixel sequences.

FIG. 16 illustrates the same graph as in FIG. 13, but here with the edge roughness after four passes with displaced edge pixel sequences. The graph is based on a simulation with typical input parameters and shows that sequence lengths of up to 16 are possible with four passes. Larger sequence lengths may cause a roughness being bigger than the grid.

Figure 17:
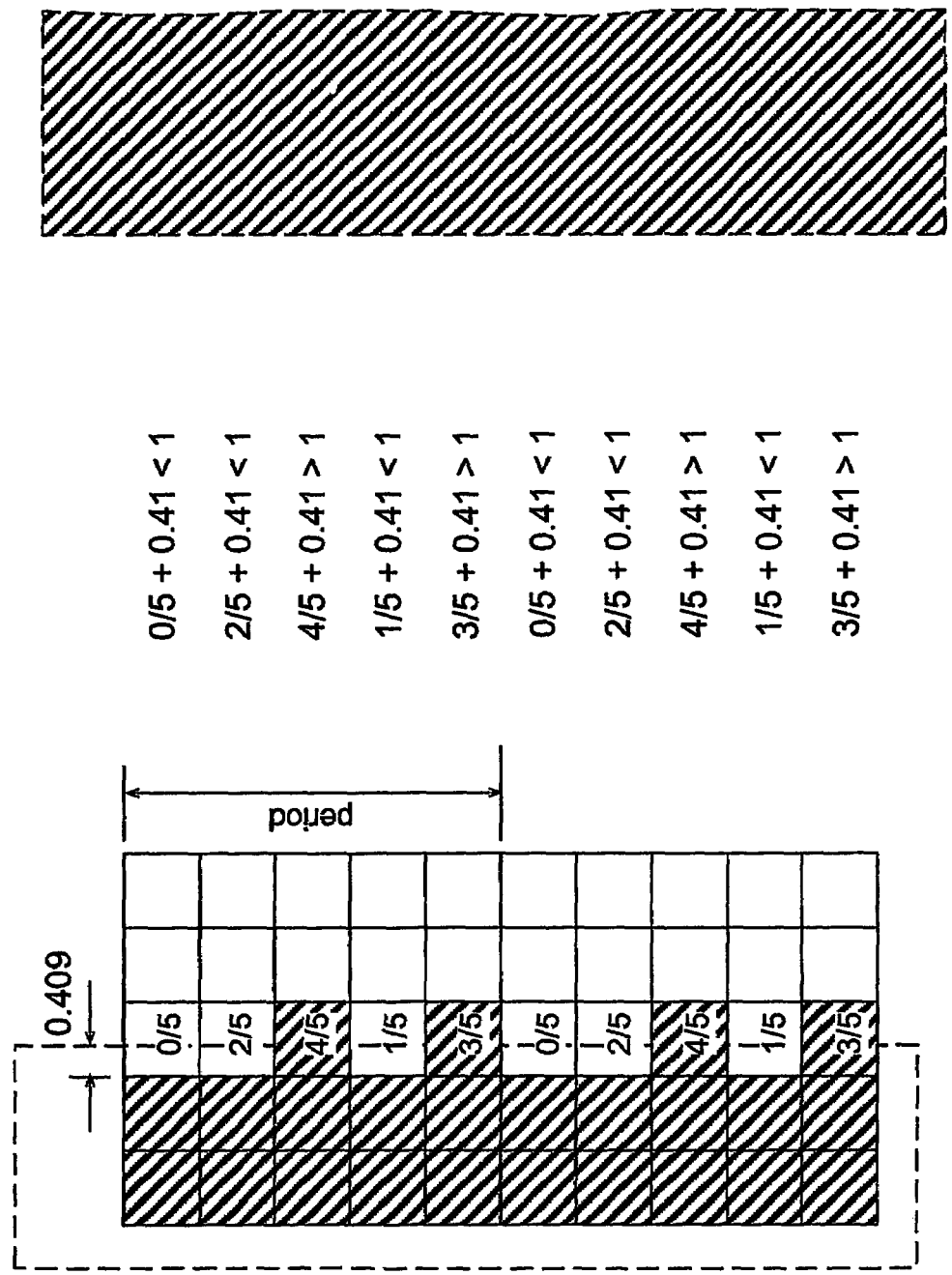
FIG. 17 depicts an algorithm for computing the edge pixel values with on off pixels.

FIG. 17 illustrates an algorithm for computing the edge pixel values with binary (on/off) pixels and a sequence period of 5. The feature edge is located 0.409 units onto a pixel in a middle column. The sequence in beforehand determined to be 0, 2, 4, 1, 3. The criteria for setting a pixel to an on state in the feature edge column is that $P+(s_i/L)>1$, where P is the position of the feature edge, $s_i$ is the individual number in the sequence and L is a length of the sequence.

Figure 18:
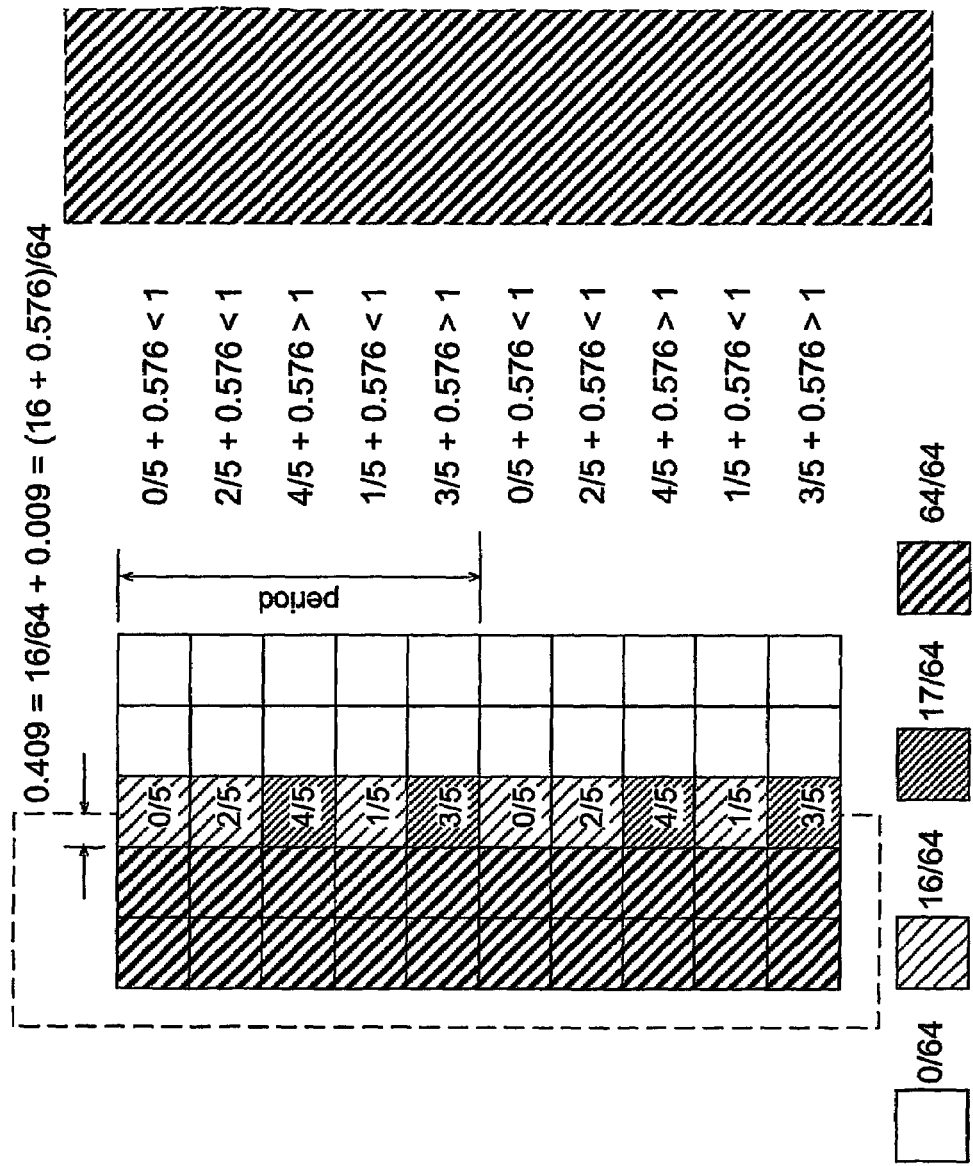
FIG. 18 depicts the same as in FIG. 1 but with a 65-valued pixel.

FIG. 18 illustrates essentially the same as FIG. 17, but here 65-valued pixels are used. In this case $0.409=16/64+0.009=(16+0.576)/64$. As we are using a multi-valued pixel we are interested to know when we are going to change state from 16/64 to 17/64. Therefore P=0.576.

Figure 19:
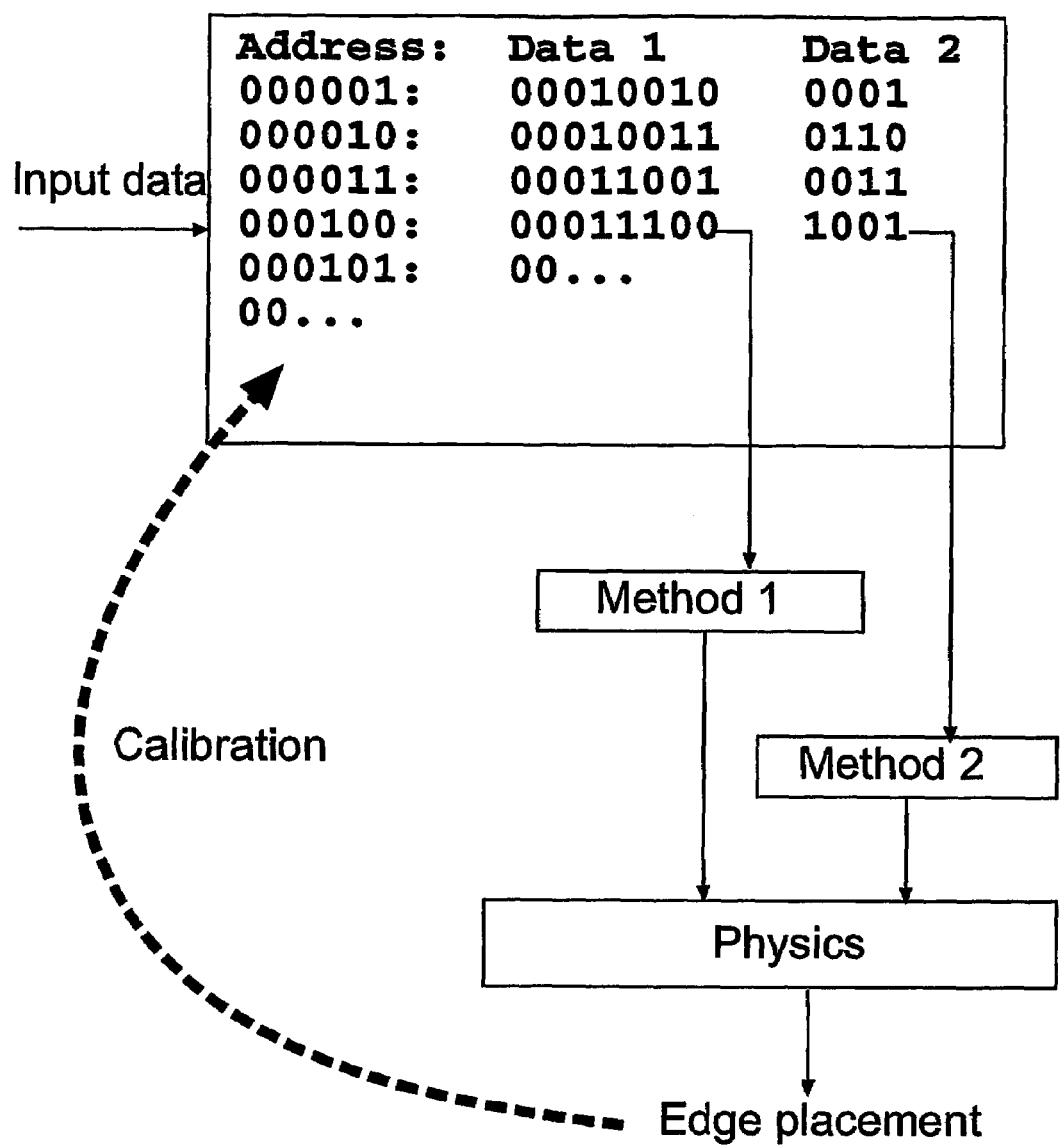
FIG. 19 depicts a combination of two methods for improving the virtual grid.
Figure 33:
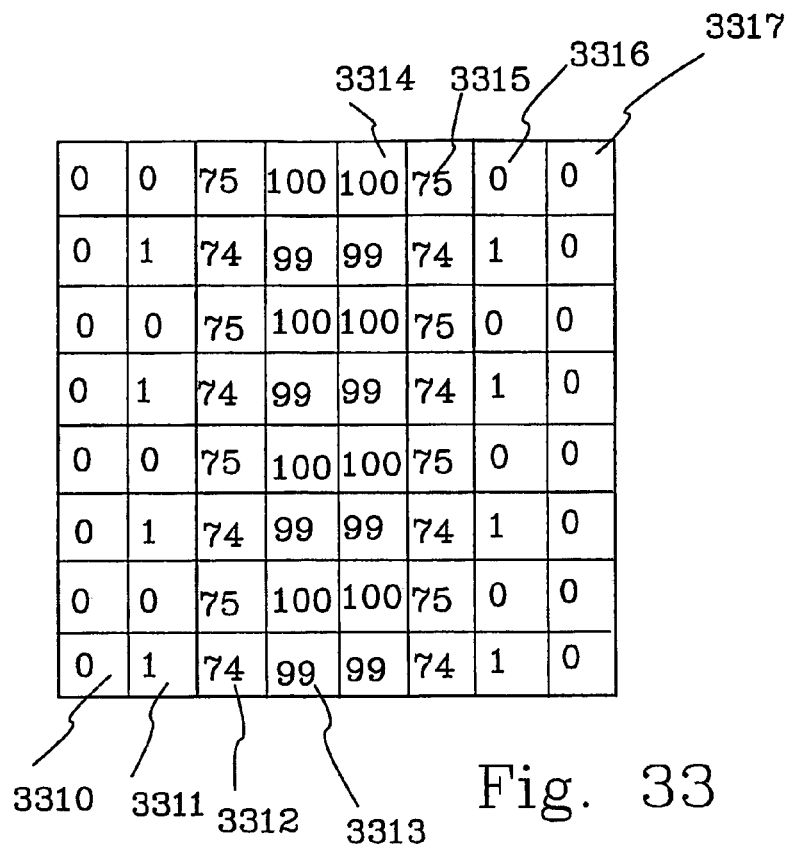
FIG. 33 illustrates still another embodiment of an inventive feature edge pattern in a Spatial Light Monitor (SLM).

FIG. 19 illustrates a combination of two methods for obtaining a finer address grid. An example is the use of analog edge pixels in more than one row, as illustrated in FIG. 9, FIG. 32 and FIG. 33. An effectiveness of pixels in different columns may be different and the columns may combine in a linear or non-linear fashion. The use of two such methods can be used in the invention with a calibrated lookup table. Input data gives a look-up value for each of the methods, in the example for the analog values in the columns. The look-up table typically more output bits than address bits, so that a 6-bit address may generate two 8-bit values. The 8-bit values are generated during a calibration step when the edge placements for different combination of values are measured and mapped to the input values. In the more simple case of a single method the same look-up table structure may be used, but only with one output for each input.

Figure 20B:
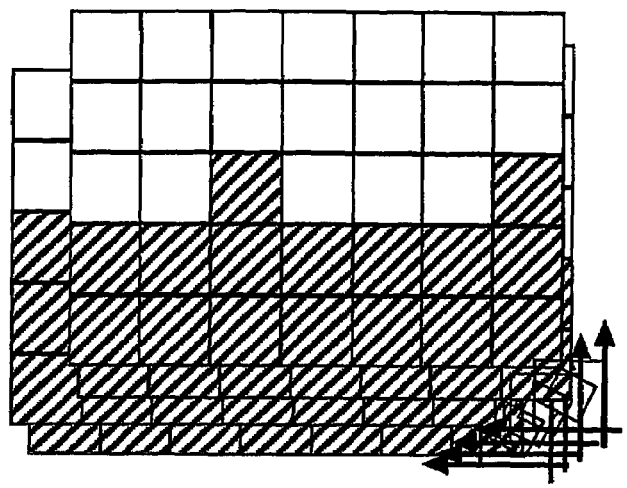
FIG. 20b illustrates another embodiment of a multipass scheme.
Figure 20A:
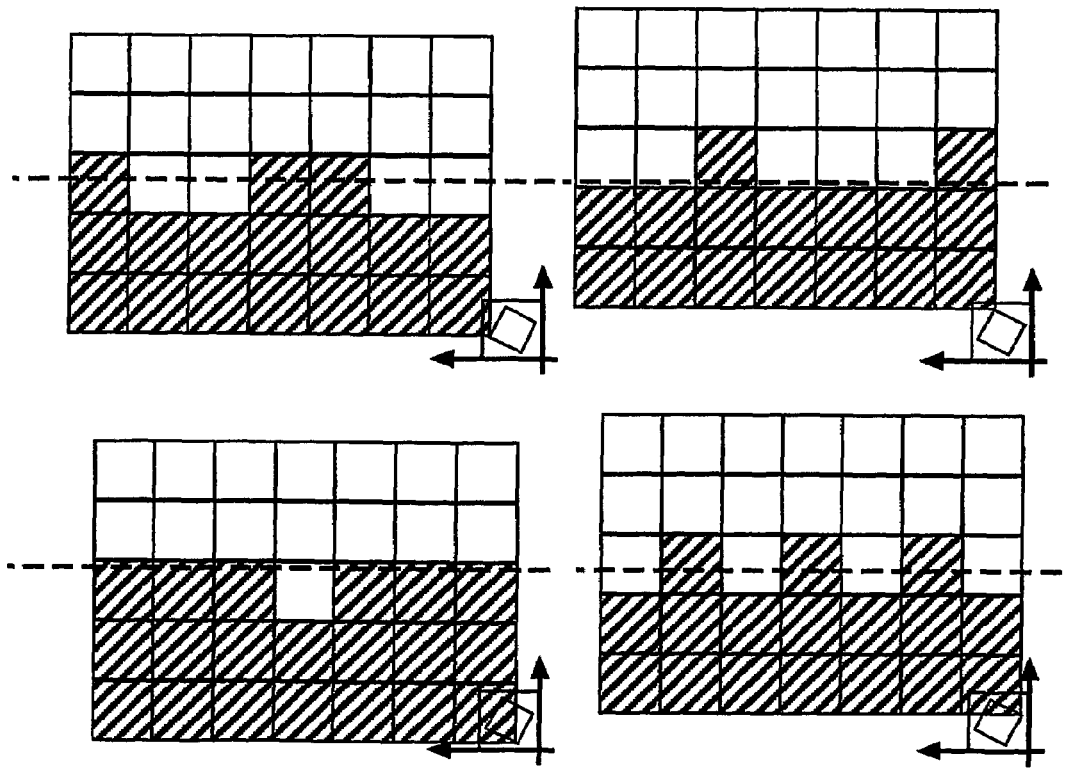
FIG. 20a illustrates one embodiment of a multipass scheme.

FIGS. 20a and b illustrates a multipass scheme with different edge sequences in the different passes and where the passes are displaced relative to each other. FIG. 20a illustrates the different sequences of the feature edge pixels. FIG. 20b illustrates how the passes are overlaid. Because of the displacement between the passes the dashed line, which represent the feature edge, will show up in different locations in the different passes. For each position of the final edge position there is at least one combination of feature edge patterns, which most likely all are different, which will result in an essentially smooth edge. The pixels in FIGS. 20a and b are on/off pixels.

Figure 21A:
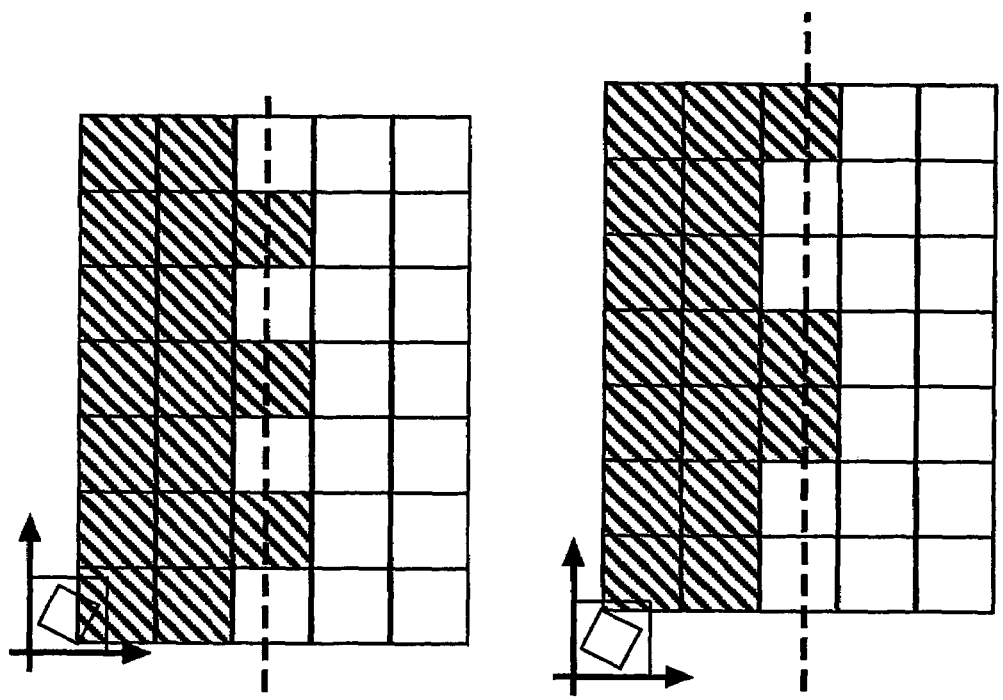
FIGS. 21a and b illustrates the difference between two passes when the input feature edge moves one address unit.
Figure 21B:
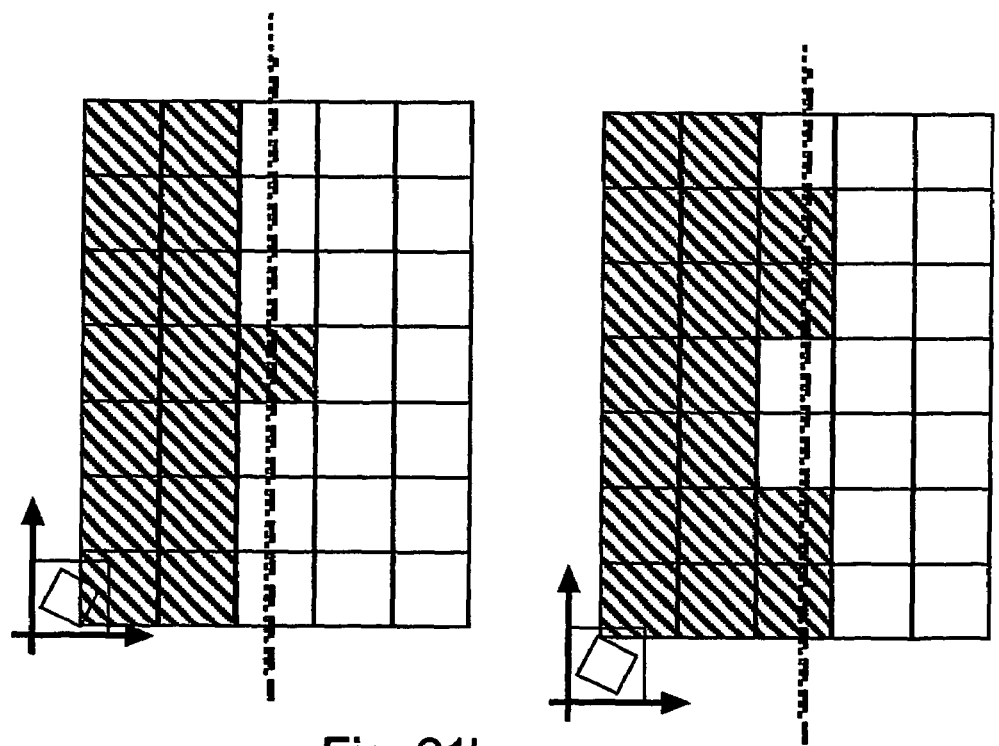

FIGS. 21a and b illustrates t that the edge pixels may be completely reshuffled in the passes when the input edge move only one address unit. FIG. 21a illustrates two passes at one edge placement. FIG. 21b illustrates the same two passes when the input edge has moved one virtual grid unit to the left compared to FIG. 21a. One pixel value has been changed from on to off (six pixels in on state in FIG. 21a and 5 pixels in on state in FIG. 21b in the feature edge column) and then the pixels have been reshuffled for best LER and edge acuity.

Figure 22:
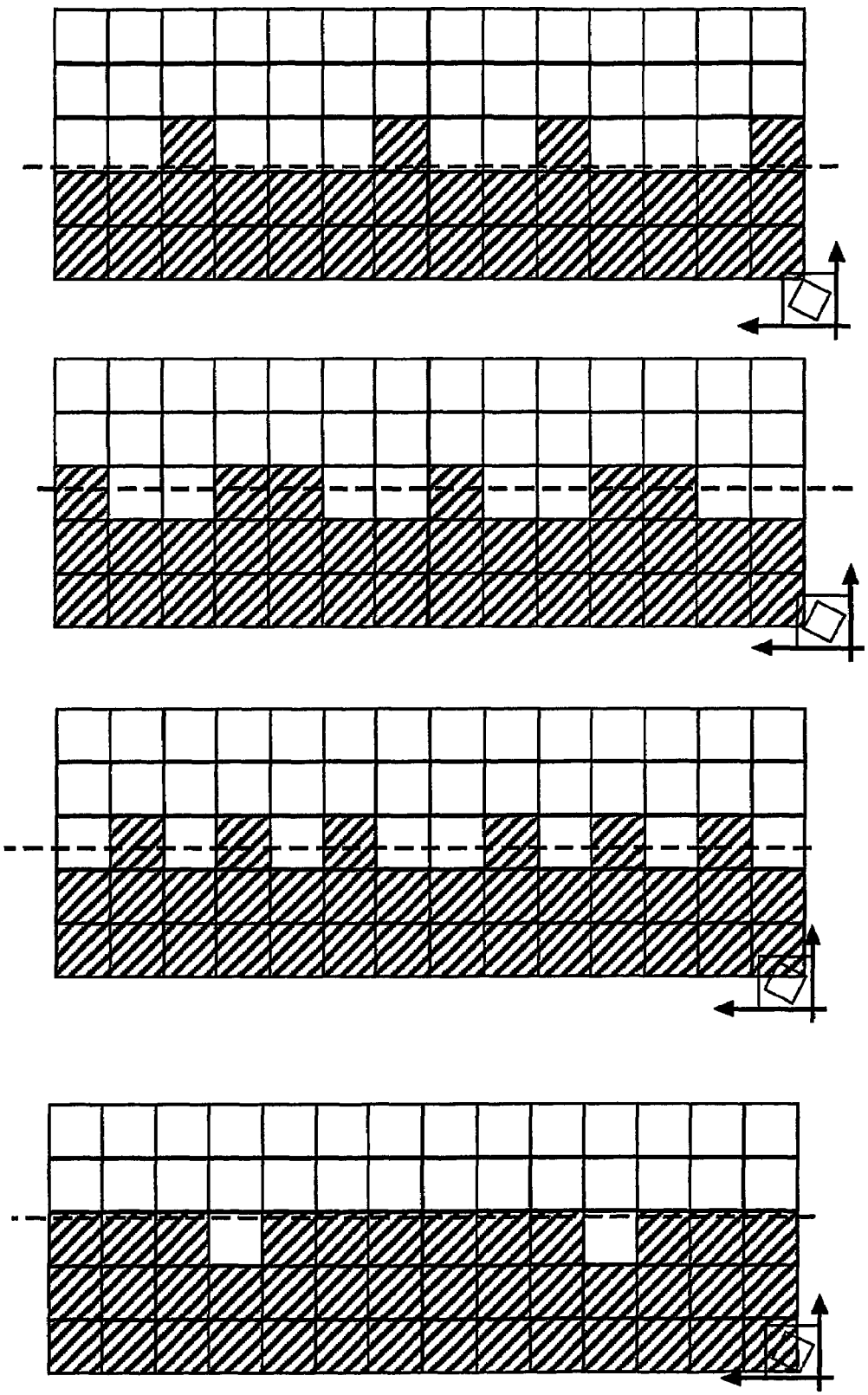
FIG. 22 illustrates one embodiment of a multipass scheme.

FIG. 22 illustrates four passes with a long and unequal periodic sequences giving a virtual grid of ⅛ of the pixel size. The sequence length is 7. For each virtual grid step one pixel is flipped from off to on. After 7 steps the same sequences can be reused but with an order between the passes changed or rotated. It is not necessary that the sequences are periodic, non-periodic sequences can be found with essentially the same properties. It is also possible to use more or fewer passes and different displacements between the passes or no displacement at all.

Figure 23A:
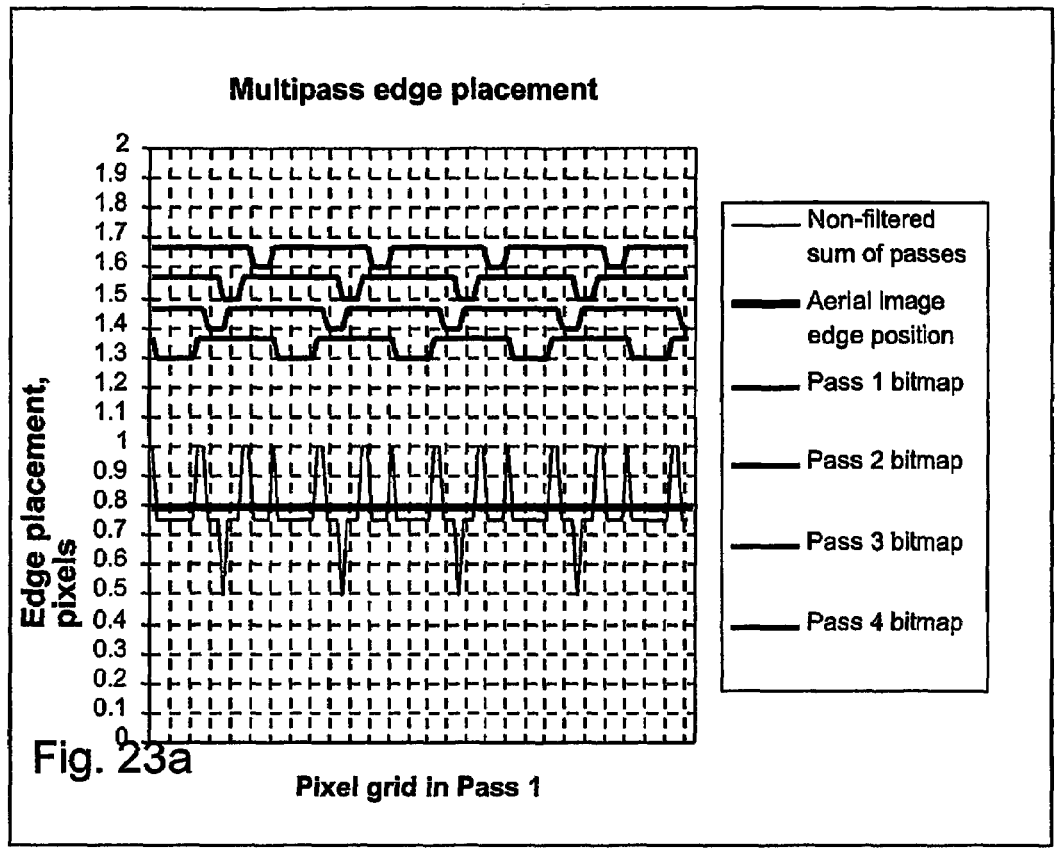
FIGS. 23a and b illustrates graphs showing edge roughness.
Figure 23B:
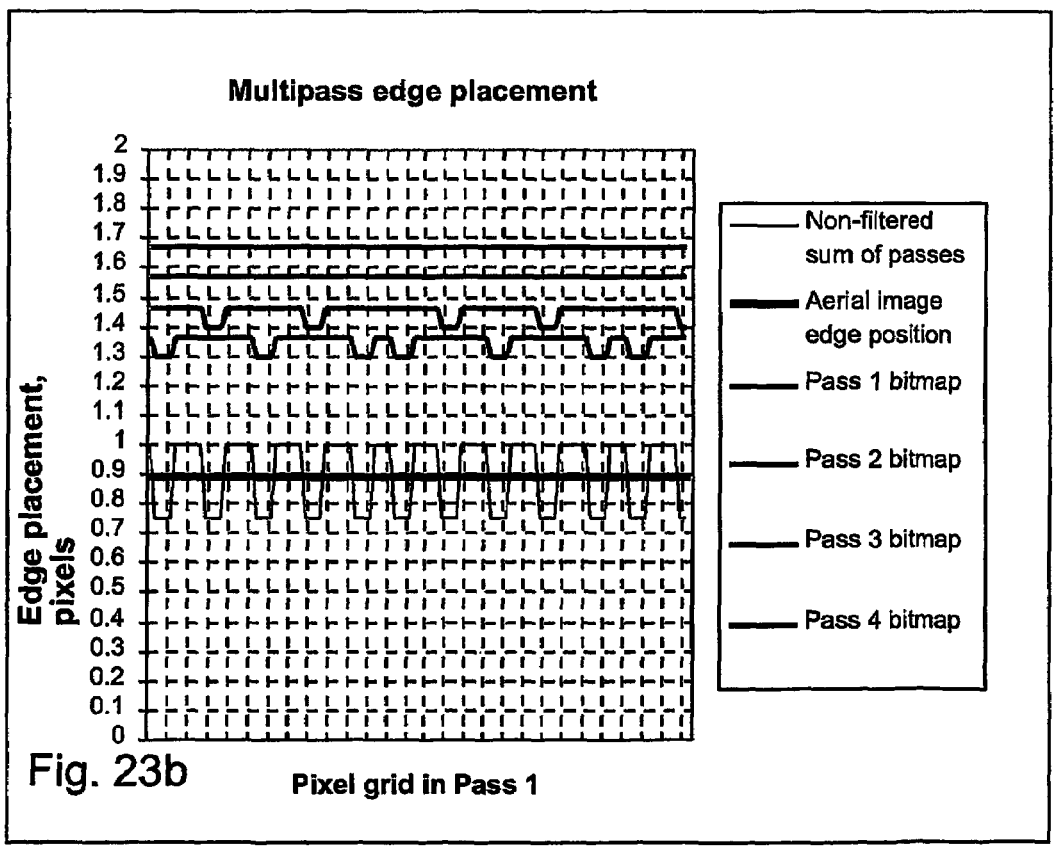

Two graphs showing the edge roughness in each pass and four combined passes are illustrated in FIGS. 23a and 23b. FIG. 23a shows the bitmap for one feature edge placement and FIG. 23b for another feature edge placement. In FIG. 23a there is no low frequency contribution.

Figure 24A:
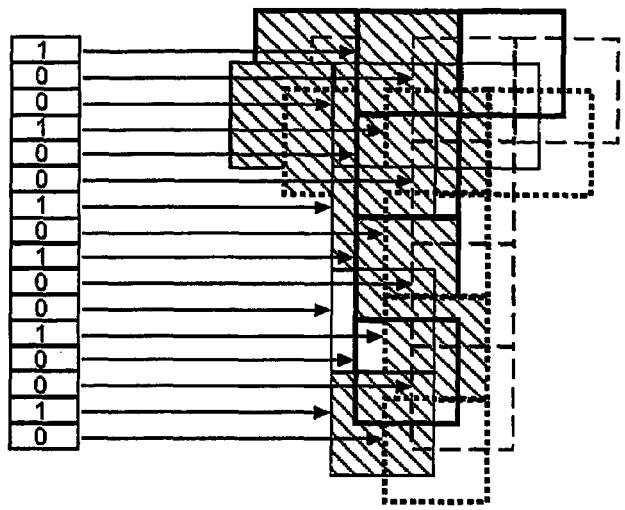
FIGS. 24a and b illustrates procedures to calculate optimal or near optimal sequences of feature edge pixels.

FIGS. 24a and b illustrates two methods for calculating optimal or near optimal edge pixel sequences for different edge locations. The computed sequences are computed off-line and tabulated for use during rasterization. FIG. 24a illustrates a binary sequence representing the edge pixels in different passes. The pixels used are two-valued pixels. Four passes are used with an inventive displacement scheme as described hereinabove. The sequence of edge pixels is illustrated to be non-periodic. This illustration in FIG. 24a is only one among many alternative ways for accomplishing the invention. FIG. 24a shows that one column of pixels in each pass is controlled by a sequence, i.e., there are four columns that are controlled in a four pass scheme. It is of course possible to control a four-pass scheme with other number of columns.

Figure 24B:
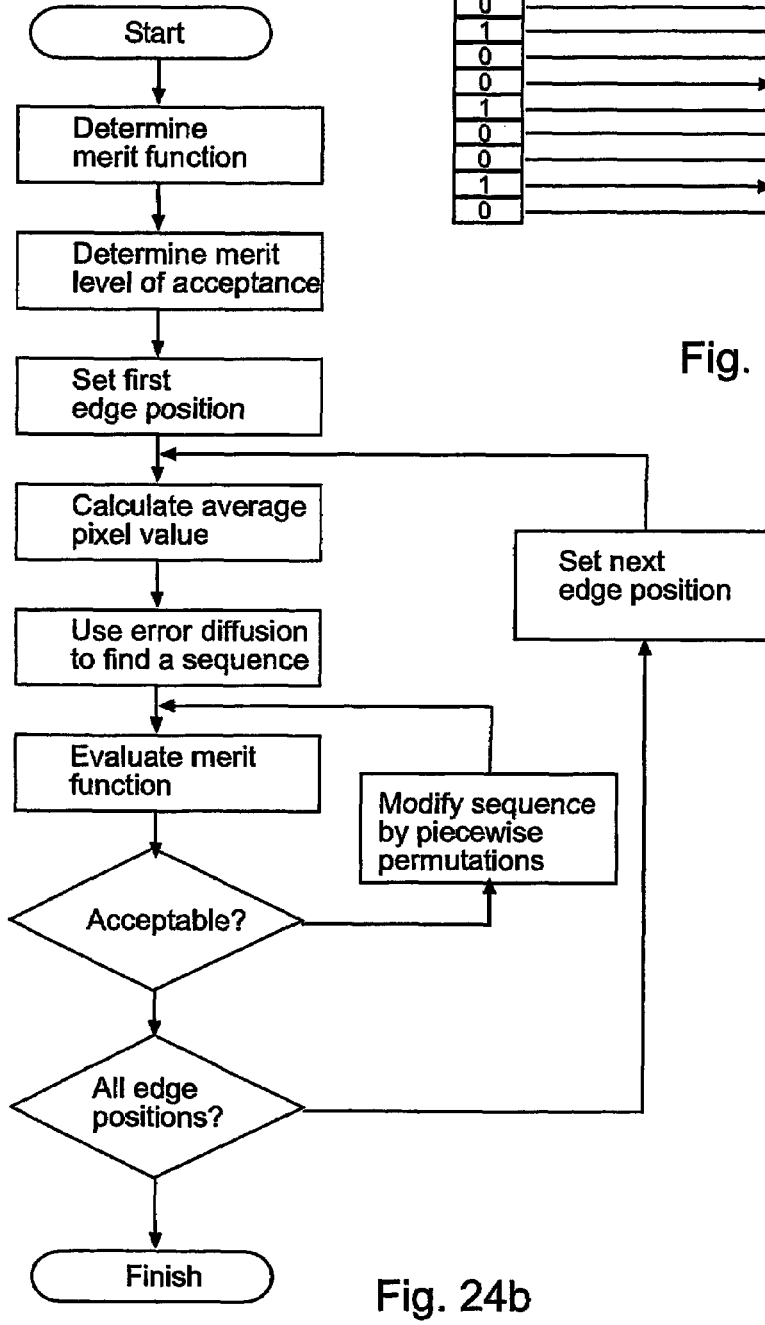

FIG. 24b illustrates an algorithm for generating a sequence with good properties for each edge position given by an input address grid. An error diffusion algorithm may be used to generate starting binary sequences. Error diffusion algorithms can be found in textbooks relating to computer graphics. Error diffusion algorithms give an approximately uniform distribution of 0s and 1s. The sequence may be further improved by iterative permutations of short sequences. Permutations preserve the average edge position while on the other hand affecting edge roughness, which is evaluated in an imaging model. A simple imaging model may first be used for a quick generation of candidate sequences. Candidate sequences may then be further analyzed/evaluated by a more comprehensive model, e.g., by a commercial lithography simulation program. Once a sequence satisfying the acceptance level has been found, the sequence is accepted and the algorithm moves to the next edge location.

Figure 25A:
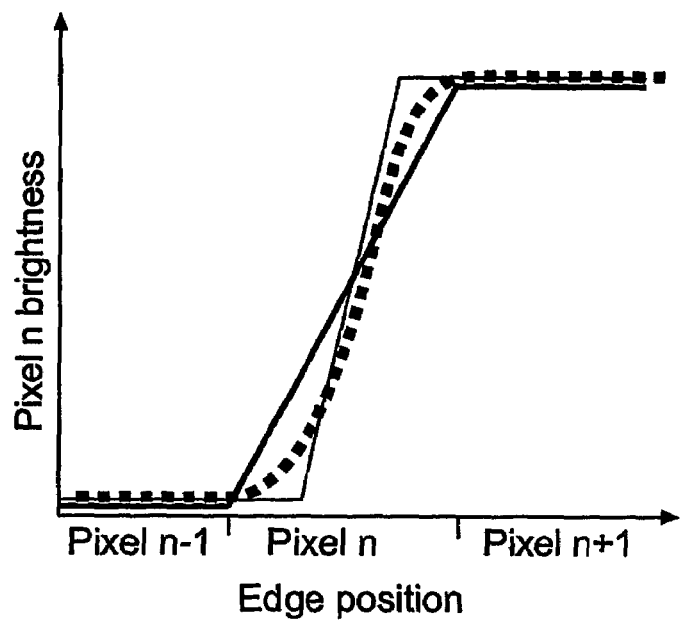
FIG. 25a illustrates a non-linear rasterizing function.
Figure 25B:
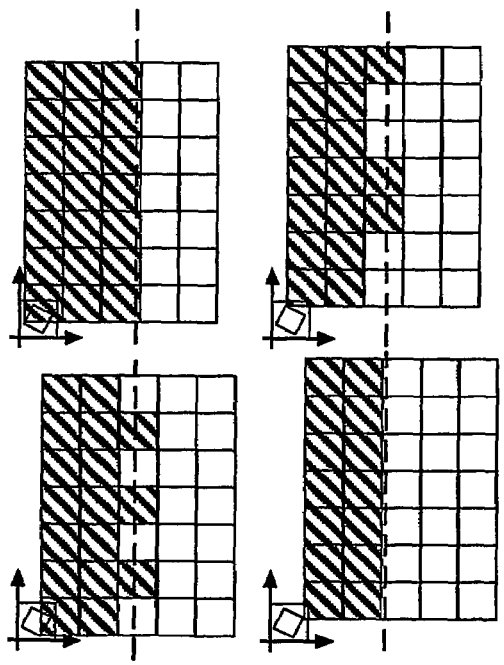
FIG. 25b illustrates the same as FIG. 20 but with non-linear rasterizing function.

FIGS. 25a and b illustrates a non-linear rasterizing function. The pixel or average column vs. the overlap between a feature in input data and a pixel area. FIG. 25a illustrates a graph showing a linear function, a piecewise straight-line non-linear function and a smooth non-linear function. All three are idealized, since in reality they get truncated to staircase functions. FIG. 25b illustrates the same as FIG. 20, but here with a non-linear rasterizing function giving better edge acuity, since only two of the passes have edge pixels. Each position of the feature edge may be independently optimized. The virtual grid in FIG. 25b is ¹⁄₁₆ of a pixel size. By looking at the pixels at the feature edge and using four writing passes, one can use 100% exposure in one pass for feature edge pixels and 0% exposure in another writing pass for feature edge pixels. For the remaining two passes one can use a steeper rasterizing function.

Figure 26A:
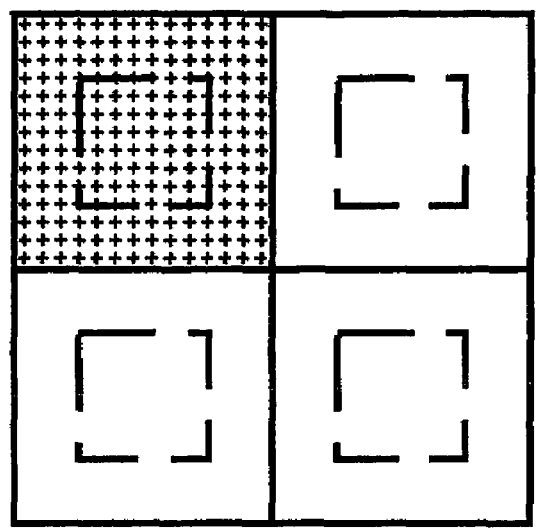
FIG. 26a-c illustrates the accomplishment of non-linear rastarizing.
Figure 26B:
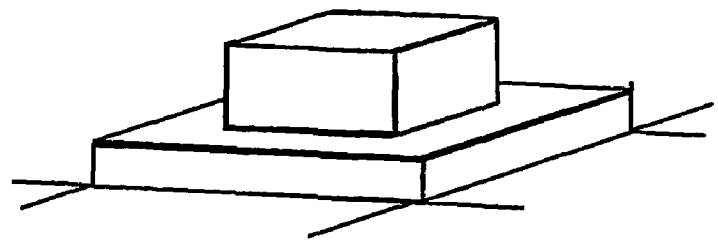
Figure 26C:
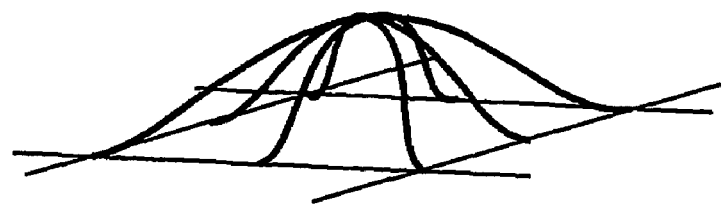

FIG. 26a-c illustrates how non-linear rasterizing can be accomplished in a super-sampling rasterizer. Inside each pixel a feature is rasterized on a finer grid, the super-sampling super-grid. The pixel value is the number of super grid points that are set by the rasterizer. With equal weight on every super-grid point, the rasterizing is linear, if a larger weight function is applied to the super-grid points near the center of the pixel a non-linear rasterizing function will result. In FIG. 26b a weight function with a center square with a higher weight is shown. In FIG. 26c a continuous weight function is illustrated with a higher weight in a center than near the edges. By this super-sampling a steeper rasterizing function may be accomplished.

Figure 27B:
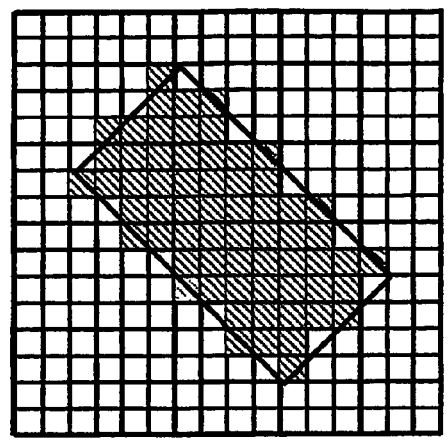
FIG. 27a-c illustrates the weight function for non-linear rasterizing using the displacement scheme in FIG. 7.
Figure 27A:
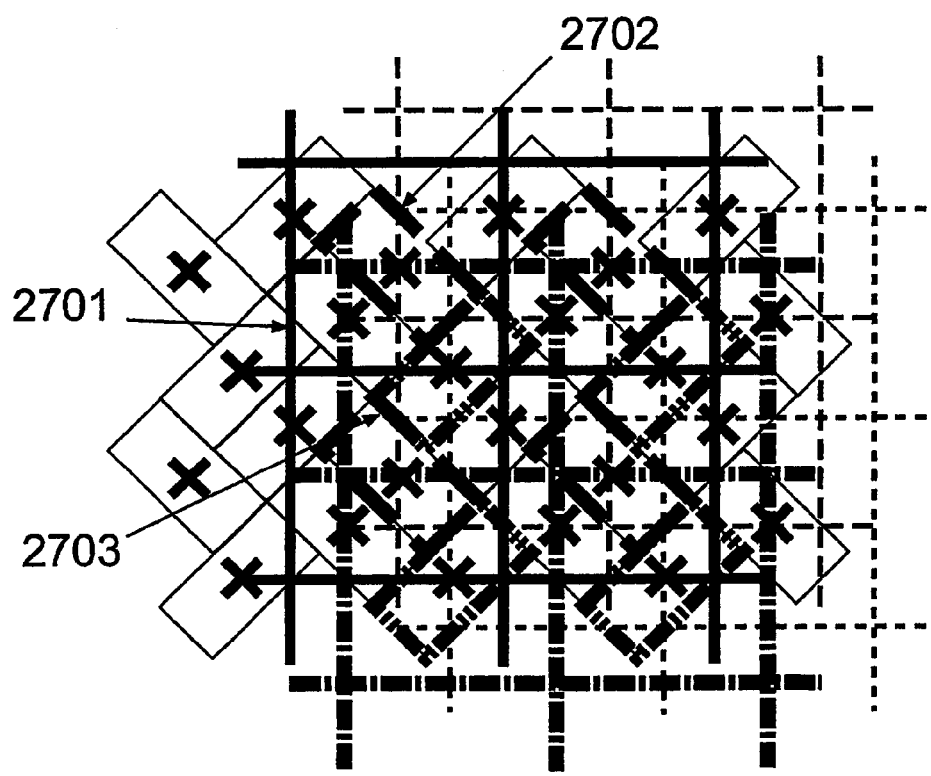

FIG. 27a illustrates a weight function for non-linear rasterizing using the displacement scheme in FIG. 7. FIG. 27a illustrates pixel areas within a pass 2701 that fill the area with four times overlap after four passes. The rectangular areas 2702, with higher weight function, are smaller and fill the area without overlap after four passes. The rectangles have to be rotated by 90 degrees in two of the passes 2703. Super-sampling over either of these two area sizes gives a correct pixel representation of an input pattern, i.e., it is not possible to place a small feature anywhere so that its area is not reflected accurately by the pixel values. There are other area shapes that have the same property with a different overlap factor, e.g., 2 or 8. Since each of the two area shapes give correct rasterizing, every linear combination of them is also correct.

FIG. 27b illustrates a pixel with a super-sampled grid. One weight function is applied over the central rectangle and another over the remainder of the pixel.

Figure 27C:
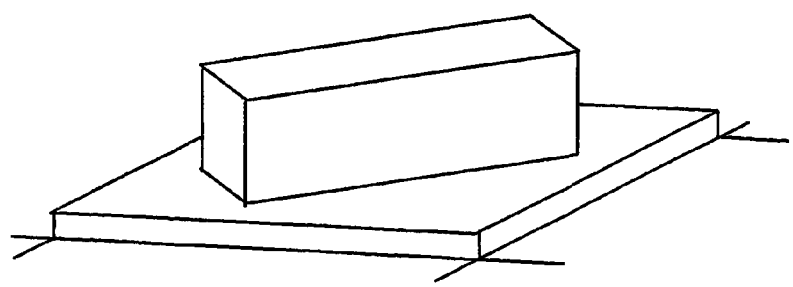

FIG. 27c illustrates the weight function in FIG. 27b in three dimensions. The height of a central area and a plateau may be chosen arbitrarily based on the degree of non-linearity wanted.

Figure 28A:
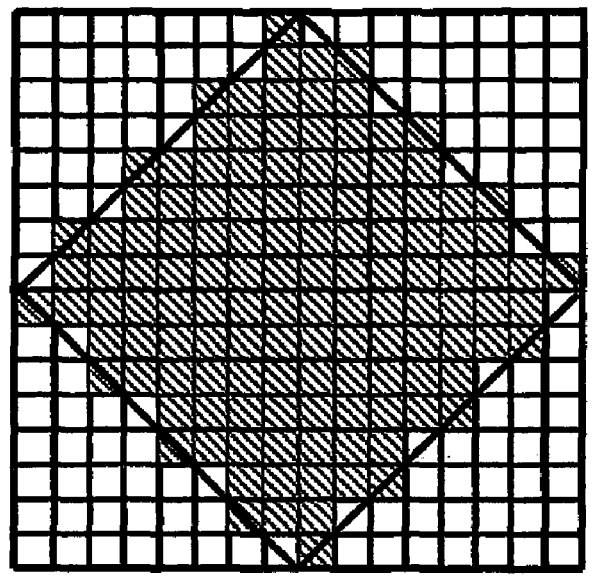
FIG. 28a-b illustrates another embodiment of the weight function.
Figure 28B:
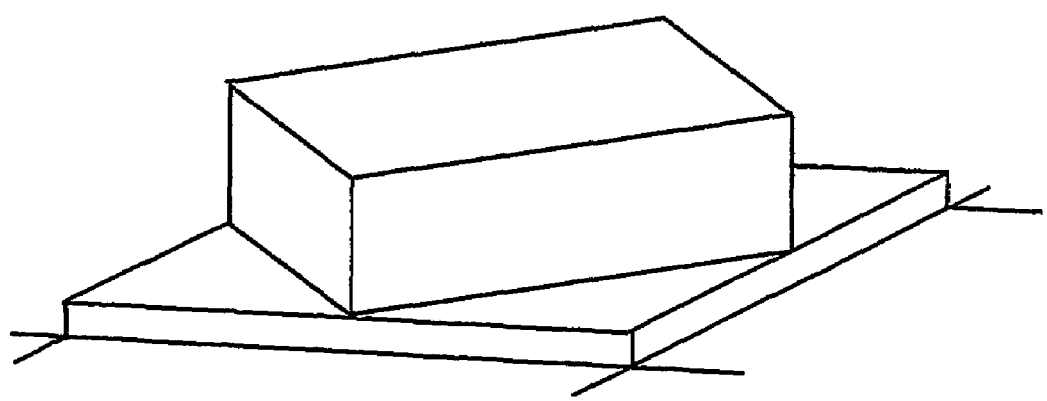

FIGS. 28a and b illustrates a weight function analog to FIGS. 27b and c for two passes offset half a pixel size in x and half a pixel size in y. By changing the weight between within the rectangle and outside said rectangle one can change the property of the non-linearity, i.e., the steepness of the non-linear function will vary.

Figure 29:
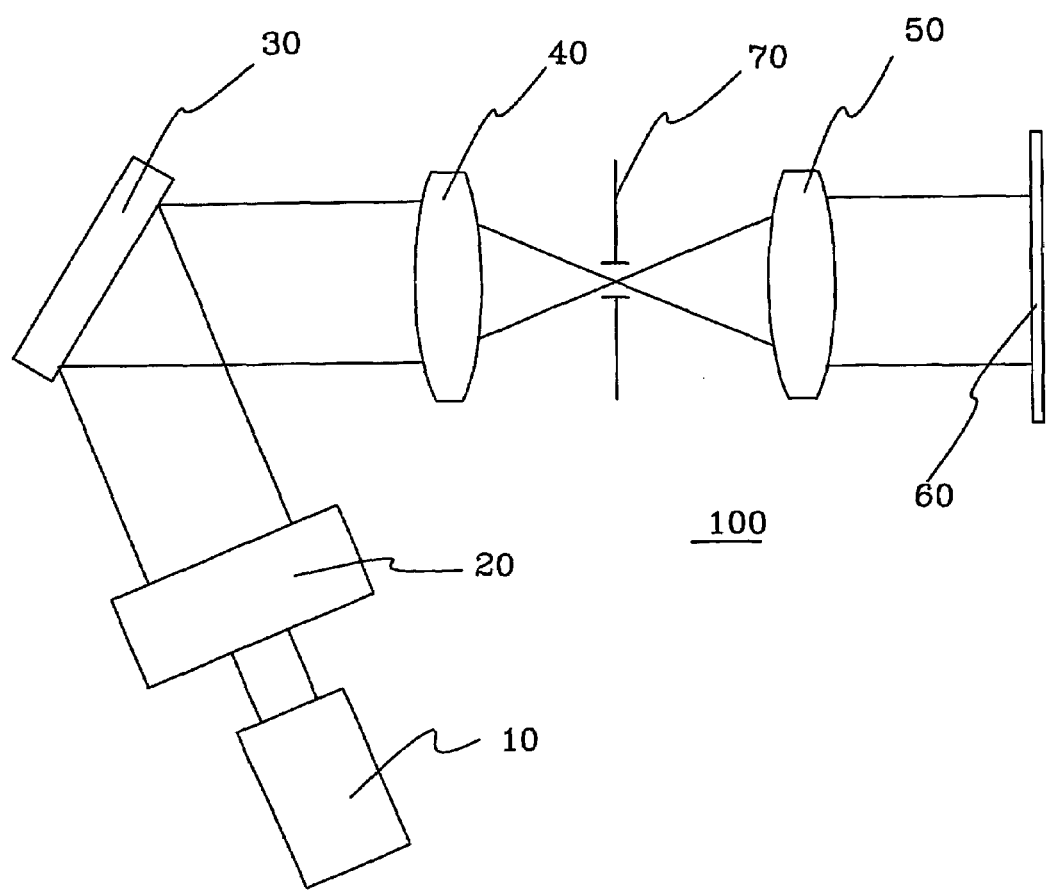
FIG. 29 illustrates one embodiment of an inventive feature edge pattern in a Spatial Light Modulator (SLM).

FIG. 29 shows an exemplary embodiment of an apparatus 1 for patterning a work piece 60. Said apparatus 1 comprising a source 10 for emitting electromagnetic radiation, a first lens arrangement 50, a computer controlled reticle 30, a beam conditioner arrangement 20, a spatial filter 70 in a Fourier plane, a second lens arrangement 40.

The source 10 may emit radiation in the range of wavelength from infrared (IR), which is defined as 780 nm up to about 20 nm, to extreme ultraviolet (EUV), which in this application is defined as the range from 100 nm and down as far as the radiation is possible to be treated as electromagnetic radiation, i.e. reflected and focused by optical components. The source 10 emits radiation either pulsed or continuously. The emitted radiation from the continuous radiation source 10 can be formed into a pulsed radiation by means of a shutter located in the radiation path between said radiation source 10 and said computer controlled reticle 30. As an example can the radiation source 10, i.e. the source of an exposure beam, may be a KrF excimer laser with a pulsed output at 248 nm, a pulse length of approximately 10 ns and a repetition rate of 1000 Hz. The repetition rate may be below or above 1000 Hz.

The beam conditioner unit may be a simple lens or an assembly of lenses or other optical components. The beam conditioner unit 20 distributes the radiation emitted from the radiation source 10 uniformly over at least a part of the surface of the computer controlled reticle 30. In a case of a continuous radiation source a beam of such a source may be scanned over the surface of the computer controlled reticle.

Between the radiation source 10 and the computer controlled reticle 30, which may for instance be a spatial light modulator (SLM), said beam conditioner unit is arranged, which unit 20 expand and shapes the beam to illuminate the surface of the SLM in a uniform manner. In a preferred embodiment with an excimer laser as the source the beam shape is rectangular, the beam divergence different in x-direction and Y-direction and the radiation intensity is often non-uniform over the beam cross-section. The beam may have the shape and size of the SLM 30 and homogenized so that the rather unpredictable beam profile is converted to a flat illumination with a uniformity of, for example, 1-2%. This may be done in steps: a first beam shaping step, a homogenizing step and a second beam-shaping step. The beam is also angularly filtered and shaped, so that the radiation impinging on each point on the SLM has a controlled angular sub tense.

The optics of the invention is similar to that of a wafer stepper. In steppers the beam is homogenized in a light pipe, a rectangular or prism-shaped rod with reflecting internal walls where many mirror images of the light source are formed, so that the illumination is the superposition of many independent sources. The homogenization may also be performed by splitting and recombining the beam by refractive, reflective or diffractive optical components.

The SLM 30 is fed with a digital description of the pattern to be printed. The pattern may firstly be made in an ordinary commercially available drawing program. Before the pattern file is fed to the SLM, said pattern file is divided and transformed to a recognized formed for the SLM.

FIG. 30 shows a Spatial Light Modulator (SLM) 200 comprising a 2-dimensional array of pixels, in this embodiment 8 rows 3001 and eight columns 3002, i.e. 64 pixels in total. In reality the SLM may comprise several millions of pixels but for reasons of clarity an SLM with few pixels is chosen.

Micromirror pixels may for instance be 20×20 μm. A projection lens with a reduction of 200× will make one pixel on the SLM correspond to 0.1 μm in the image on the workpiece. Each pixel may be controlled to 64 levels, thereby interpolating the pixel of 100 nm into 64 increments of 1.56 nm each.

The two leftmost columns of pixels 3010, 3011 and the two rightmost columns of pixels 3016, 3017 are set in a so called black state, i.e. the pixels are in a state which will not create any radiation onto the workpiece, indicated in FIG. 1 by 0. The two columns in the middle 3013, 3014 are set in a so-called white state, i.e. the pixel are in a state which will create maximum radiation onto the workpiece, indicated in FIG. 30 by 100. Pixels in columns 3010, 3011, 3016 and 3017 are outside feature pixels. Pixels in columns 3013 and 3014 are inside feature pixels. Pixels in columns 3012 and 3015 are boundary feature pixels. The boundary feature pixels are, as indicated in FIG. 1, set along the boundary of the feature in alternate states, in this case indicated by 74 and 75. In this embodiment every second boundary feature pixel is set to 74 and the rest to 75. As can be seen from the same figure, the states of the boundary feature pixels in column 212 do not match the boundary feature pixels in column 3015, i.e. the boundary feature pixels indicated by 75 do not belong to the same rows. In an alternative embodiment, the boundary feature pixels do match each other, i.e. the boundary feature pixels indicated by a same gray level are located in the same row.

As an alternative to setting every second boundary feature pixel to one gray level and the rest to another gray level, every second pair of boundary feature pixels may be set to alternate states. With each pixel controlled into 64 levels, a pixel size of 100 nm on the workpiece, and by setting the boundary feature pixels in the SLM in alternate states, an address grid of 0.78 nm is achievable in one writing step. In FIG. 30, the boundary feature pixels are represented by single columns 3012, 3015.

A smoother feature edge will be created with every boundary feature pixel set to a first gray scale value and the rest of the pixels set to an adjacent gray scale value, which may be higher or lower compared to if longer sequences of alternate states are chosen in a single writing pass.

In an alternative embodiment, as illustrated in FIG. 31, the boundary feature pixels are represented by two columns. In FIG. 31 the leftmost and rightmost column 3110 and 3117 respectively are set to the black state and pixels in these two columns are representing outside feature pixels. Inside feature pixels are represented in figure two in columns 3113 and 3114. Boundary feature pixels are represented in columns 3111, 3112, 3115 and 3116.

In this embodiment, every second pixel in a leftmost boundary feature pixel column 3111 and a rightmost boundary feature pixel column 3116 are set to 1 and the rest to 0 grayscale level. Here the pixels in the leftmost boundary feature pixel column 3111 set to 0 match the higher value of the pixels in the other boundary feature pixel column 3112, here 75, creating together one of the feature edges on the work piece. The same applies for the two columns 3115 and 3116 creating together another feature edge on the workpiece, i.e. the 0's in the rightmost column 3116 match the higher value, here 75, of the pixels in the other boundary feature pixel column 3115 and the 1's in the rightmost column 3116 match the lower value, here 73, of the pixels in the other boundary feature pixel column 3115.

Alternatively the reverse may apply, i.e. having two boundary feature pixel columns creating one feature edge on the workpiece, the higher alternate state (grayscale value) in one of these columns may match the higher alternate state (grayscale value) in the other of these columns.

Instead of extending the boundary feature pixel columns into outside feature pixel columns, said columns may be extended into inside feature pixel columns as illustrated in FIG. 32. In FIG. 32 columns 3210, 3211, 3216 and 3217 represent outside feature pixel columns. Columns 3212, 3213, 3214, 3215 represent boundary feature pixel columns. Here we have no inside feature pixel columns because the line to be written is only represented by 4 columns, and two columns represent one edge of the line. As can be seen from FIG. 32, all higher alternate values match each other, i.e. the 100's in columns 3213 and 3214 match the 75's in column 3212 and 3215. Alternatively higher values in the outmost boundary feature pixel columns 3212 and 3215 may match lower values in the inmost boundary feature pixel columns 3213 and 3214.

FIG. 33 illustrates still another embodiment of an inventive feature edge pattern in a Spatial Light Modulator (SLM). Here three columns represent the boundary feature pixels. The leftmost and rightmost column 3310 and 3317 respectively are set to the black state and pixels in these two columns are representing outside feature pixels. Boundary feature pixels are represented in columns 3311, 3312, 3313, 3314, 3315 and 3316. There are no inside feature pixels represented in FIG. 33.

In this embodiment, every second pixel in a leftmost boundary feature pixel column 3311 and a rightmost boundary feature pixel column 3316 are set to 1 and the rest to 0 grayscale level. Here, the pixels in the leftmost boundary feature pixel column 3311 are set to 0 and they are matching the higher gray scale value of the pixels in the boundary feature pixel columns 3312, 3313, 3314, 3315. The 0 gray scale value match in this embodiment 75 gray scale value in columns 3312 and 3315, where the rest of the pixels in columns 3312 and 3315 are set to 74. The 0 gray scale value match in this embodiment 100 gray scale value in columns 3313 and 3314, where the rest of the pixels in columns 3313 and 3314 are set to gray scale value 99 in. Columns 3311, 3312, 3313, 3314, 3315, 3316, 3317 are creating together the feature edges of a straight line.

Figure 34A:
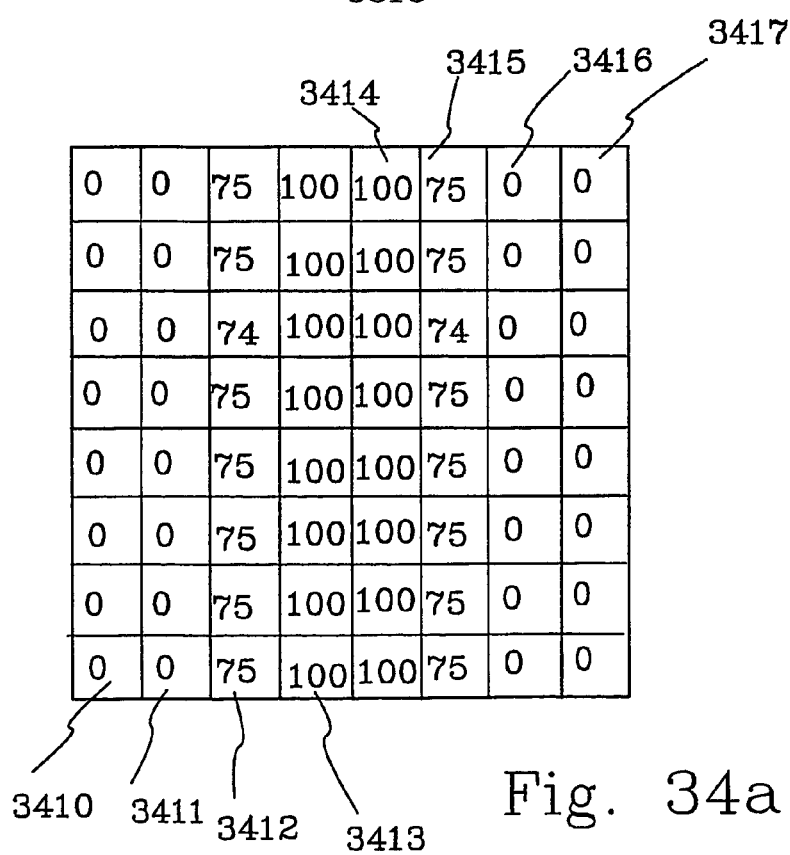
FIG. 34a illustrates a first writing pass of another embodiment of an inventive feature edge pattern in a Spatial Light Modulator (SLM).

FIG. 34a illustrates a first of four writing passes for creating a straight line with a fine address grid. The pixels in columns 3410, 3411, 3416 and 3417 are set to gray scale value zero. The pixels in columns 3413 and 3414 are set to gray scale value 100. Columns 3410, 3411, 3416 and 3417 are, according to the previous language used in the former embodiments, outside feature pixel columns and columns 3413 and 3414 are, using the same language, inside feature pixel columns. Columns 3412 and 3415 are boundary feature pixel columns. In the first writing pass all pixels in said boundary feature pixel columns are set to a first grayscale value except for at least one pixel which is set to a second gray scale value. In this embodiment as illustrated in FIG. 34a, seven out of eight pixels in the respective columns are set the gray scale value 75. One pixel in column 3412 is set to gray scale value 74 and one pixel in column 3415 is set to gray scale value 74. Here the gray scale value 74 in columns 3412 and 3415 match each other i.e. they are exactly opposite to each other. However, in an alternative embodiment, said second gray scale value may not be equal in both boundary feature pixel columns and may not be positioned exactly opposite to each other.

Figure 34B:
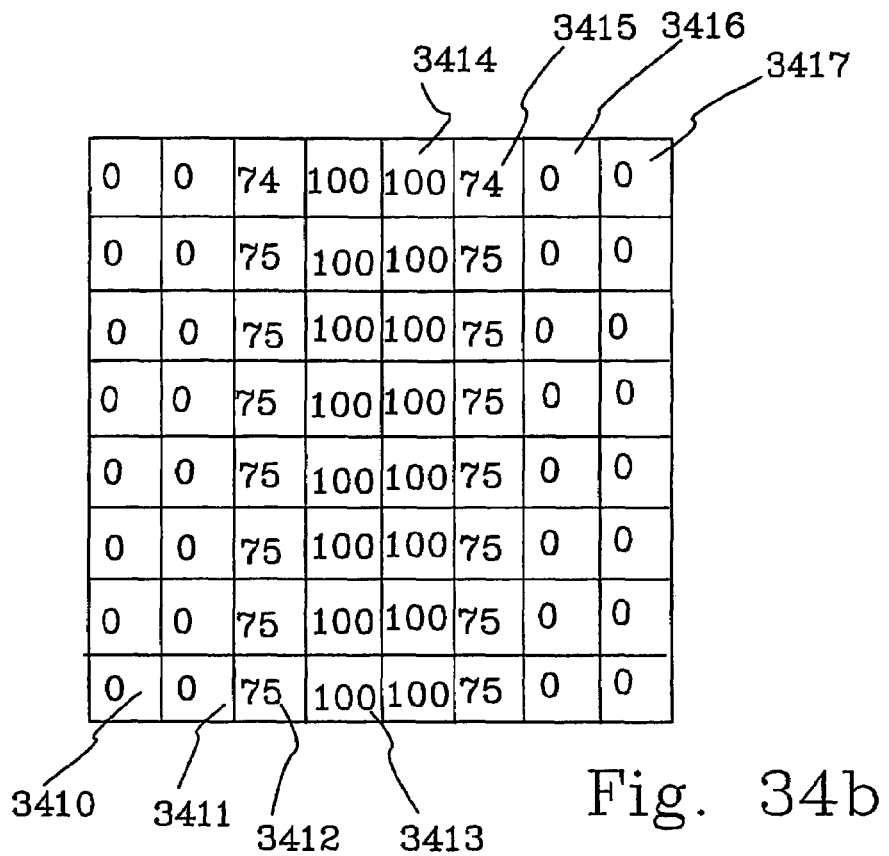
FIG. 34b illustrates a second writing pass.

FIG. 34b illustrates a second writing pass out of four for creating a straight line. The only difference between FIG. 34b and FIG. 34a is that the second gray scale value in the boundary feature pixel columns 3412 and 3415 have moved from the third position from top in FIG. 34a to a top position in FIG. 34b.

Figure 34C:
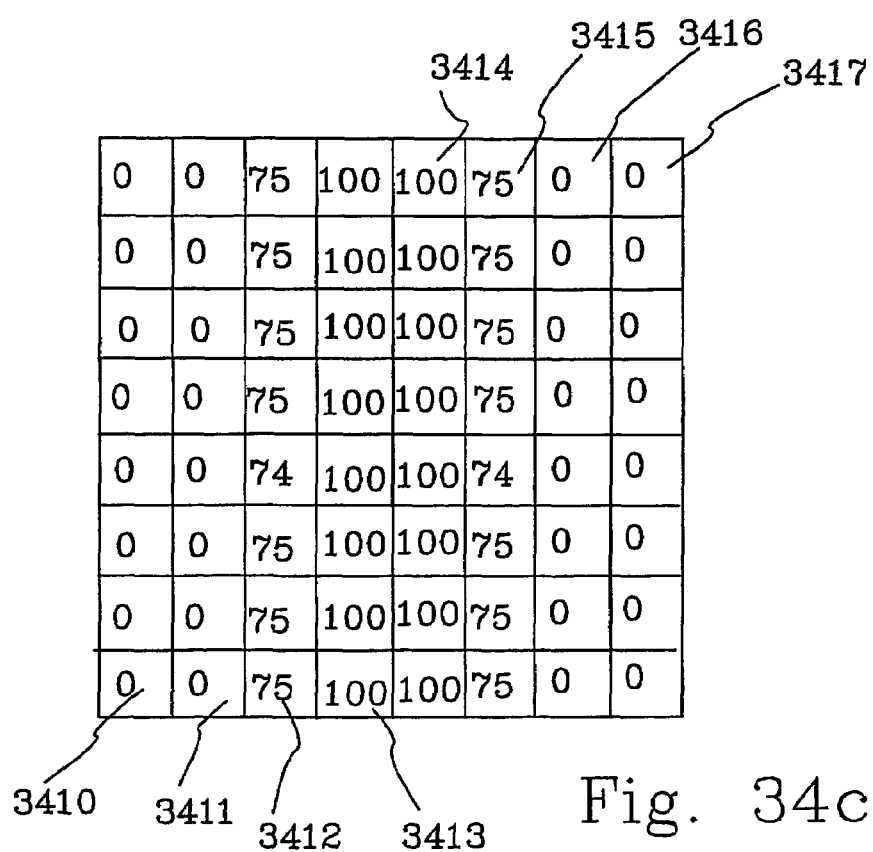
FIG. 34c illustrates a third writing pass.

FIG. 34c illustrates a third writing pass out of four for creating a straight line. The only difference between FIG. 34b and FIG. 34c is that the second gray scale value in the boundary feature pixel columns 3412 and 3415 have moved from the top position in FIG. 34b to a fifth position from top in FIG. 34c.

Figure 34D:
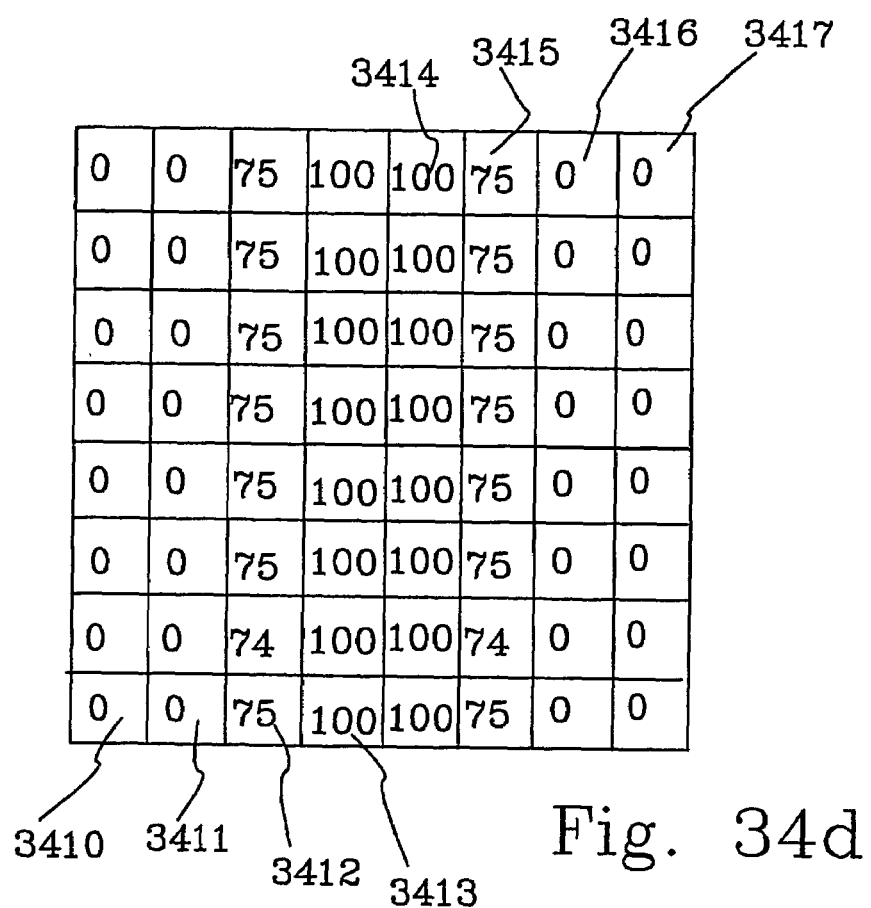
FIG. 34d illustrates a fourth writing pass.

FIG. 34d illustrates a fourth writing pass out of four for creating a straight line. The only difference between FIG. 34d and FIG. 34c is that the second gray scale value in the boundary feature pixel columns 3412 and 3415 have moved from the fifth position from top in FIG. 34c to a bottom position in FIG. 34c.

When superposing said first, second, third and forth writing passes the effect of said second grayscale value will be essentially the same as the lower grayscale value in boundary feature pixel columns 3412 and 3415 in FIG. 1.

FIG. 34e illustrates a writing pass scheme in an embodiment of four writing passes and a pixel sequence length of eight pixels. 1:st, 2:nd, 3:rd, 4:th Columns represent one boundary feature pixel column in the first, second, third and fourth writing pass respectively. Pixels in said boundary feature pixel column in the first writing pass, as illustrated in FIG. 34e in the leftmost column, are first set individually to a sequence of grayscale values. At least one of the grayscale values in said sequence of eight pixels differs from the other. With the writing pass scheme as illustrated in FIG. 34e said at least one pixel, which differs from the other, will move around in the boundary feature pixel column and create a finer address grid when the respective writing pass are superposed on each other.

Alternatively, any number of pixels in the sequence may be used instead of the illustrated 8, for example 6, 12, 14 and 16 pixels. The invention is not limited to a single writing pass or four writing passes as illustrated by the figures, but can be employed with any number of writing passes, for example 2, 3 and 5.

The invention claimed is:

1. A method for creating a pattern with improved virtual grid on a workpiece sensitive to electromagnetic radiation comprising the actions of:
    emitting electromagnetic radiation onto a computer controlled reticle having a multitude of modulating elements (pixels),
    arranging the pixels in said computer controlled reticle according to a digital description,
    creating an image of said computer controlled reticle on said workpiece, wherein said pixels in said computer controlled reticle are arranged in alternate grayscale states along at least a part of one feature edge in order to create a smaller address grid.

2. The method according to claim 1, wherein said pixels in said computer controlled reticle along at least one feature edge belong to a one-dimensional line of pixels.

3. The method according to claim 1, wherein said image is created in one writing pass.

4. The method according to claim 1, wherein said image is created by means of a plurality of writing passes.

5. The method according to claim 4, wherein said pixels in said computer controlled reticle along at least one feature edge are arranged differently in said plurality of writing passes.

6. The method according to claim 5, wherein, in a first writing pass, at least a first pixel along at least one feature edge is set to a first grayscale value and surrounded with pixels set to at least one other gray scale value, and in at least one other writing pass at least a second pixel along said at least one feature edge is set to said first grayscale value with surrounding pixels set to at least one other gray scale value.

7. The method according to claim 6, wherein the pattern is created by four writing passes.

8. The method according to claim 6, wherein said at least one pixel in the different writing passes set to said first grayscale value are non overlapping.

9. The method according to claim 6, wherein said surrounding pixels are set to the same grayscale value.

10. The method according to claim 6, wherein said surrounding pixels are set to the different grayscale values.

11. The method according to claim 1, wherein said pixels in said computer controlled reticle along at least one feature edge belong to at least two lines of pixels.

12. The method according to claim 11, wherein said pixels in said at least two lines are weighted differently when forming said virtual grid.

13. The method according to claim 1, wherein said pixels are micromirrors in an SLM.

14. The method according to claim 1, wherein said pixels are transmissive.

15. An apparatus for creating a pattern on a workpiece sensitive to electromagnetic radiation comprising:
- a source to emit electromagnetic radiation onto a computer controlled reticle having a multitude of modulating elements (pixels),
- a projection system to create an image of said computer controlled reticle on said workpiece, wherein said pixels in said computer controlled reticle are arranged in alternate grayscale states along at least a part of a boundary of at least one element to be patterned, in order to fine-adjust the position of an edge of said element in said image to be created on the workpiece.

16. The apparatus according to claim 15, wherein said pixels in said computer controlled reticle along at least one feature edge belong to a one-dimensional line of pixels.

17. The apparatus according to claim 15, wherein said image is created in one writing pass.

18. The apparatus according to claim 15, wherein said image is created by means of a plurality of writing passes.

19. The apparatus according to claim 18, wherein said pixels in said computer controlled reticle along at least one feature edge are arranged differently in said plurality of writing passes.

20. The apparatus according to claim 19, wherein, in a first writing pass, at least a first pixel along at least a part of one feature edge is set to a first grayscale value and surrounded with pixels set to at least a second gray scale value, and in at least a second writing pass at least a second pixel along said part of said feature edge is set to said first grayscale value with surrounding pixels set to at least said second gray scale value.

21. The apparatus according to claim 20, wherein the pattern is created by four writing passes.

22. The apparatus according to claim 20, wherein said pixels set to said first grayscale value in the different writing passes are non overlapping.

23. The apparatus according to claim 22, wherein said pixels set to said first grayscale value in the different writing passes are spaced apart with at least one pixel.

24. The apparatus according to claim 20, wherein said surrounding pixels are set to the same grayscale value.

25. The apparatus according to claim 20, wherein said surrounding pixels are set to the different grayscale values.

26. The apparatus according to claim 15, wherein said pixels in said computer controlled reticle along at least a part of one feature edge belong to a line with a width of two pixels.

27. The apparatus according to claim 15, wherein said pixels in said computer controlled reticle along at least one feature edge belong to a line with a width of three pixels.

28. The apparatus according to claim 15, wherein said pixels are micromirrors in an SLM.

29. The apparatus according to claim 15, wherein said computer controlled reticle is a transmissive SLM.

* * * * *